United States Patent
Machida

(10) Patent No.: US 12,342,638 B2
(45) Date of Patent: Jun. 24, 2025

(54) IMAGING DEVICE

(71) Applicant: Panasonic Intellectual Property Management Co., Ltd., Osaka (JP)

(72) Inventor: Shinichi Machida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 495 days.

(21) Appl. No.: 17/932,483

(22) Filed: Sep. 15, 2022

(65) Prior Publication Data
US 2023/0026531 A1    Jan. 26, 2023

Related U.S. Application Data

(63) Continuation of application No. PCT/JP2021/009975, filed on Mar. 12, 2021.

(30) Foreign Application Priority Data

Mar. 31, 2020    (JP) .................................. 2020-062361

(51) Int. Cl.
H10F 39/12    (2025.01)
C09K 11/02    (2006.01)
(Continued)

(52) U.S. Cl.
CPC ............ H10F 39/191 (2025.01); C09K 11/02 (2013.01); H04N 25/62 (2023.01); H10F 39/805 (2025.01);
(Continued)

(58) Field of Classification Search
CPC ......... H10F 39/191–195; H10F 39/805; H10F 39/8057; H10K 30/35; H10K 39/32
See application file for complete search history.

(56) References Cited

U.S. PATENT DOCUMENTS

2010/0187501 A1    7/2010    Toda
2016/0035780 A1*   2/2016    Itahashi ................. H04N 25/78
                                                      257/432

FOREIGN PATENT DOCUMENTS

JP    2008-004899    1/2008
JP    2010-177392    8/2010
(Continued)

OTHER PUBLICATIONS

International Search Report of PCT application No. PCT/JP2021/009975 dated Jun. 8, 2021.
(Continued)

*Primary Examiner* — Daniel P Shook
(74) *Attorney, Agent, or Firm* — Rimon P.C.

(57) ABSTRACT

An imaging device includes: a semiconductor substrate; a plurality of pixel electrodes located above the semiconductor substrate and each electrically connected to the semiconductor substrate; a counter electrode located above the plurality of pixel electrodes; a first photoelectric conversion layer located between the counter electrode and the plurality of pixel electrodes; and at least one first light-shielding body located in the first photoelectric conversion layer or above the first photoelectric conversion layer. The first photoelectric conversion layer contains semiconductor quantum dots that absorb light in a first wavelength range and a coating material that covers the semiconductor quantum dots, the coating material absorbing light in a second wavelength range, the coating material emitting fluorescence in a third wavelength range. The at least one first light-shielding body absorbs or reflects light with a wavelength in at least part of the second wavelength range.

16 Claims, 19 Drawing Sheets

(51) Int. Cl.
*H04N 25/62* (2023.01)
*H10F 39/00* (2025.01)
*H10K 30/30* (2023.01)
*H10K 30/35* (2023.01)
*H10K 39/32* (2023.01)
*H10K 85/50* (2023.01)
*B82Y 20/00* (2011.01)

(52) U.S. Cl.
CPC ......... *H10F 39/8057* (2025.01); *H10K 30/35* (2023.02); *H10K 30/353* (2023.02); *H10K 85/50* (2023.02); *B82Y 20/00* (2013.01); *H10K 39/32* (2023.02)

(56) References Cited

FOREIGN PATENT DOCUMENTS

| | | |
|---|---|---|
| JP | 2016-033982 | 3/2016 |
| WO | 2019/150971 | 8/2019 |

OTHER PUBLICATIONS

Mengxia Liu et al., "Lattice anchoring stabilizes solution-processed semiconductors", Nature vol. 570, 2019, May 22, 2019, pp. 96-101 and Supplementary Material.

\* cited by examiner

IMAGING DEVICE

BACKGROUND

1. Technical Field

The present disclosure relates to an imaging device.

2. Description of the Related Art

Extensive research has been conducted on imaging devices in which a photoelectric conversion unit including semiconductor quantum dots is stacked on a semiconductor substrate. One feature of the semiconductor quantum dots is that, when their crystal size is changed, the energy gap changes due to the quantum size effect. Therefore, by controlling the material and crystal size of semiconductor quantum dots used for a photoelectric conversion unit, an imaging device having sensitivity in a desired wavelength region can be obtained.

SUMMARY

In one general aspect, the techniques disclosed here feature an imaging device including: a semiconductor substrate; a plurality of pixel electrodes located above the semiconductor substrate and each electrically connected to the semiconductor substrate; a counter electrode located above the plurality of pixel electrodes; a first photoelectric conversion layer located between the counter electrode and the plurality of pixel electrodes; and at least one first light-shielding body located in the first photoelectric conversion layer or above the first photoelectric conversion layer. The first photoelectric conversion layer contains semiconductor quantum dots having a property of absorbing light in a first wavelength range and a coating material that covers the semiconductor quantum dots and that has a property of absorbing light in a second wavelength range and emitting fluorescence in a third wavelength range. The at least one first light-shielding body absorbs or reflects light with a wavelength in at least part of the second wavelength range.

In another general aspect, the techniques disclosed here feature an imaging device including: a semiconductor substrate; a plurality of pixel electrodes located above the semiconductor substrate and each electrically connected to the semiconductor substrate; a counter electrode located above the plurality of pixel electrodes; a first photoelectric conversion layer located between the counter electrode and the plurality of pixel electrodes; and at least one second light-shielding body located in the first photoelectric conversion layer or between the first photoelectric conversion layer and the plurality of pixel electrodes. The first photoelectric conversion layer contains semiconductor quantum dots having a property of absorbing light in a first wavelength range and a coating material that covers the semiconductor quantum dots and that has a property of absorbing light in a second wavelength range and emitting fluorescence in a third wavelength range. The at least one second light-shielding body absorbs or reflects light with a wavelength in at least part of the third wavelength range.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

There is a demand for an imaging device with reduced noise. Accordingly, the present disclosure provides an imaging device with reduced noise.

Underlying Knowledge Forming Basis of Embodiments of Present Disclosure

Semiconductor quantum dots themselves can be used as a photoelectric conversion material. However, to improve the dispersion stability in a solvent and prevent the formation of secondary particles, semiconductor quantum dots immediately after synthesis are covered with, for example, ligands.

Figure 1A:
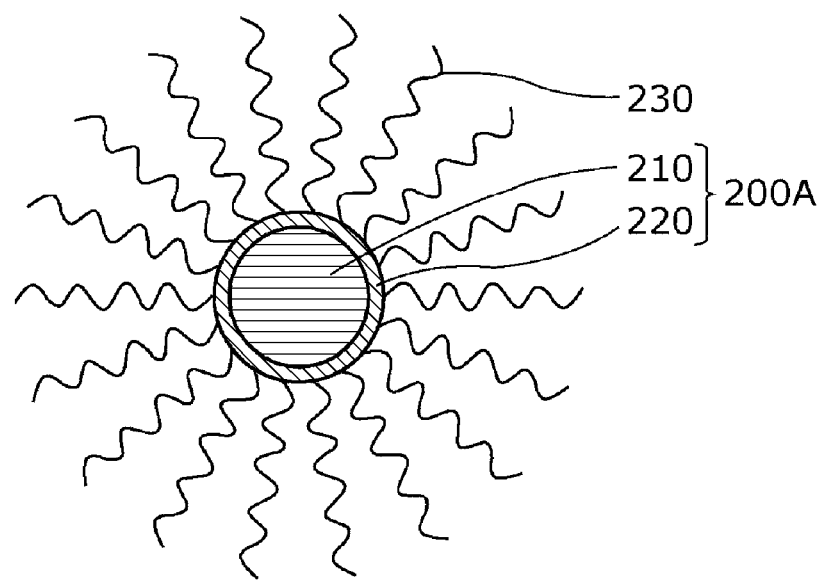
FIG. 1A is a schematic illustration showing an example of the form of a semiconductor quantum dot.
Figure 1B:
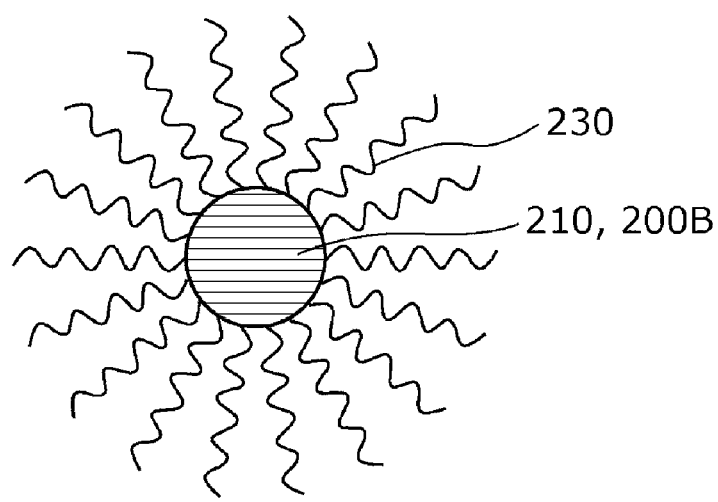
FIG. 1B is a schematic illustration showing another example of the form of the semiconductor quantum dot.

FIGS. 1A and 1B are schematic illustrations showing examples of the form of a semiconductor quantum dot. For example, FIG. 1A shows a semiconductor quantum dot 200A having a two-layer structure including a core 210 and a shell 220, and surface modification groups called ligands 230 are adsorbed or bonded to the surface of the semiconductor quantum dot 200A immediately after synthesis. FIG. 1B shows a semiconductor quantum dot 200B having a single layer structure including a core 210, and ligands 230 are adsorbed or bonded to the surface of the semiconductor quantum dot 200B immediately after synthesis. Generally, in many cases, ligands 230 covering semiconductor quantum dots immediately after synthesis are molecules having a long-chain alkyl group such as oleic acid or oleylamine. The molecules having a long-chain alkyl group inhibit electrical conduction between the semiconductor quantum dots. Therefore, by subjecting the molecules having a long-chain alkyl group to ligand exchange with shorter organic molecules, low-molecular weight molecules having a $\pi$ conjugated system, or halogen atoms, the electrical conduction between the semiconductor quantum dots can be improved.

When the ligand-exchanged semiconductor quantum dots are used for a photoelectric conversion layer, a dispersion containing the semiconductor quantum dots dispersed therein is applied to, for example, an electrode. However, when the dispersion applied to the electrode etc. contains only the semiconductor quantum dots dispersed therein, the semiconductor quantum dot thin film after drying is brittle and susceptible to cracking, so that it is difficult to form a uniform film. In this case, for example, by forming a semiconductor quantum dot thin film using a mixture of the semiconductor quantum dots and a material softer than the semiconductor quantum dots such as a semiconducting polymer or a perovskite material, the quality of the thin film after drying is improved.

International Publication No. WO2019/150971 discloses a photoelectric conversion layer containing semiconductor quantum dots. In this photoelectric conversion layer, to improve electrical conduction between the semiconductor quantum dots, ligands modifying the surface of the semiconductor quantum dots are replaced with a conductive compound having a $\pi$ conjugated system such as an acene or a thiophene compound, and the semiconductor quantum dots are mixed with a semiconducting polymer such as a thiophene-based polymer or 3-hexylthiophene (P3HT). However, when the ligand exchange is performed using the conductive compound having a $\pi$ conjugated system, it is difficult to completely remove an excess of the $\pi$ conjugated conductive compound that is not modifying the surface of the semiconductor quantum dots. Moreover, when the semiconductor quantum dots are mixed with the semiconducting polymer, not all the mixed semiconducting polymer molecules are in contact with the surface of the semiconductor quantum dots to cover them. Therefore, generally, a thin film formed from semiconductor quantum dots subjected to ligand exchange, a thin film formed from a mixture of a semiconducting polymer and semiconductor quantum dots, and a combined thin film obtained as a combination of them contain ligands and semiconducting polymer molecules that are not in contact with the semiconductor quantum dots.

Mengxia Liu et al., "Lattice anchoring stabilizes solution-processed semiconductors," Nature, 2019, Vol. 570, p. 96-101 discloses a solar cell using a structural body obtained by preparing a dispersion containing a mixture of lead sulfide (PbS) quantum dots serving as semiconductor quantum dots and a precursor of a perovskite material having a lattice constant that matches the lattice constant of the surface atoms of the quantum dots and depositing the dispersion by spin coating to form a film in which the semiconductor quantum dots are embedded in the perovskite material thin film. At the contact interfaces between the perovskite material layer and the semiconductor quantum dots, the lattice spacing between lead atoms matches the lattice spacing of the perovskite material layer. Therefore, at the interfaces formed, the formation of structural defects is inhibited, so that good solar cell characteristics are obtained. Even in the thin film of the mixture prepared by embedding the semiconductor quantum dots in the perovskite material serving as a matrix material as described above, part of the matrix material contained in the thin film is not in contact with the semiconductor quantum dots.

The present inventor has found the following problem in the course of conducting studies on an imaging device including a photoelectric conversion layer containing semiconductor quantum dots. Coating materials such as ligand materials and matrix materials including semiconducting polymers and perovskite materials are used to cover the semiconductor quantum dots and are suitable for improving the electrical conduction between the semiconductor quantum dots, and many of them absorb light and emit fluorescence. The wavelength of the light absorbed varies depending on the type of coating material and is in the ultraviolet to infrared range. The wavelength of the fluorescence emitted from the coating material varies depending on the type of material and is generally longer by several tens of nm to about 100 nm than the wavelength of the absorbed light.

Figure 2:
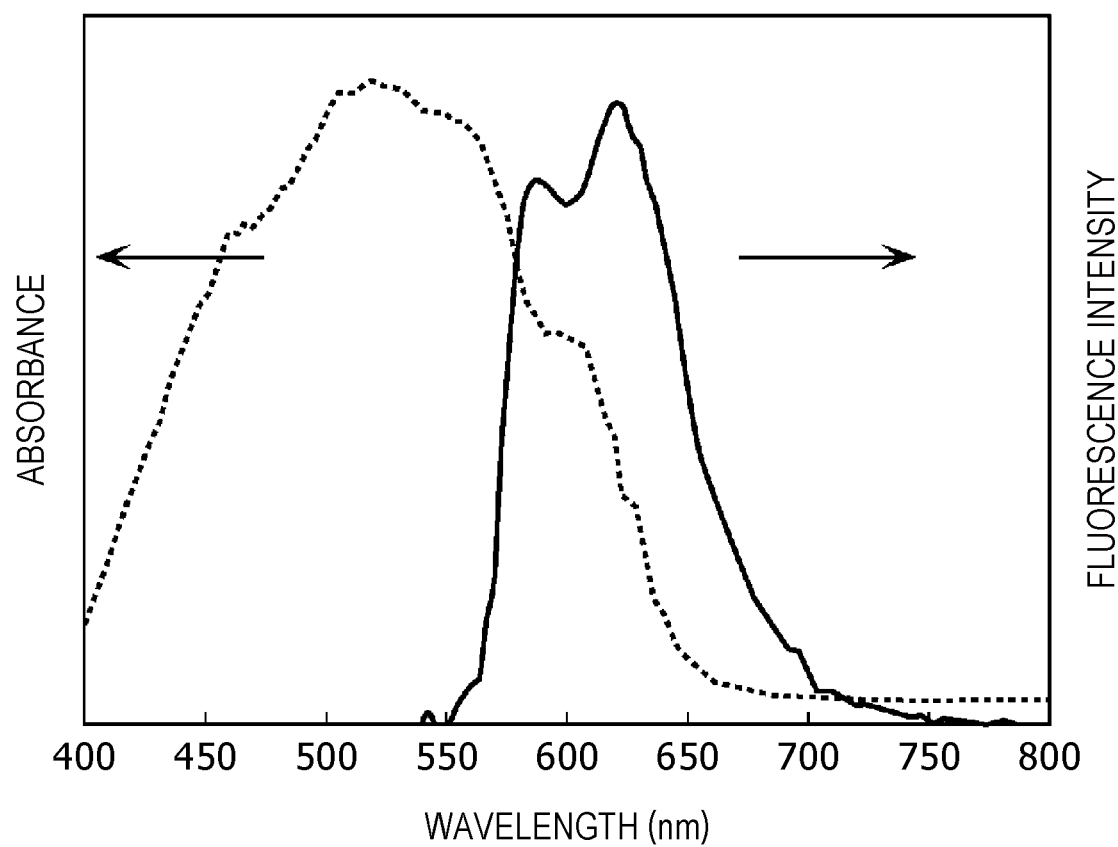
FIG. 2 is a graph showing the absorption spectrum and fluorescence spectrum of a P3HT thin film.

FIG. 2 is a graph showing the absorption spectrum and fluorescence spectrum of a P3HT thin film that is a semiconducting polymer and is an example of the matrix material. In FIG. 2, the absorption spectrum of the P3HT thin film is shown by a dotted line, and the fluorescence spectrum is shown by a solid line. In FIG. 2, the horizontal axis for the absorption spectrum and the horizontal axis for the fluorescence spectrum each represent the wavelength. The vertical axis for the absorption spectrum represents absorbance, and the vertical axis for the fluorescence spectrum represents fluorescence intensity. The same applies to FIGS. 3A to 3C used for the following description.

As shown in FIG. 2, the P3HT thin film, which is one type of semiconducting polymer, absorbs light in the wavelength range of about 400 nm to about 650 nm and emits fluorescence in the wavelength range of about 550 nm to about 750 nm.

Figure 3A:
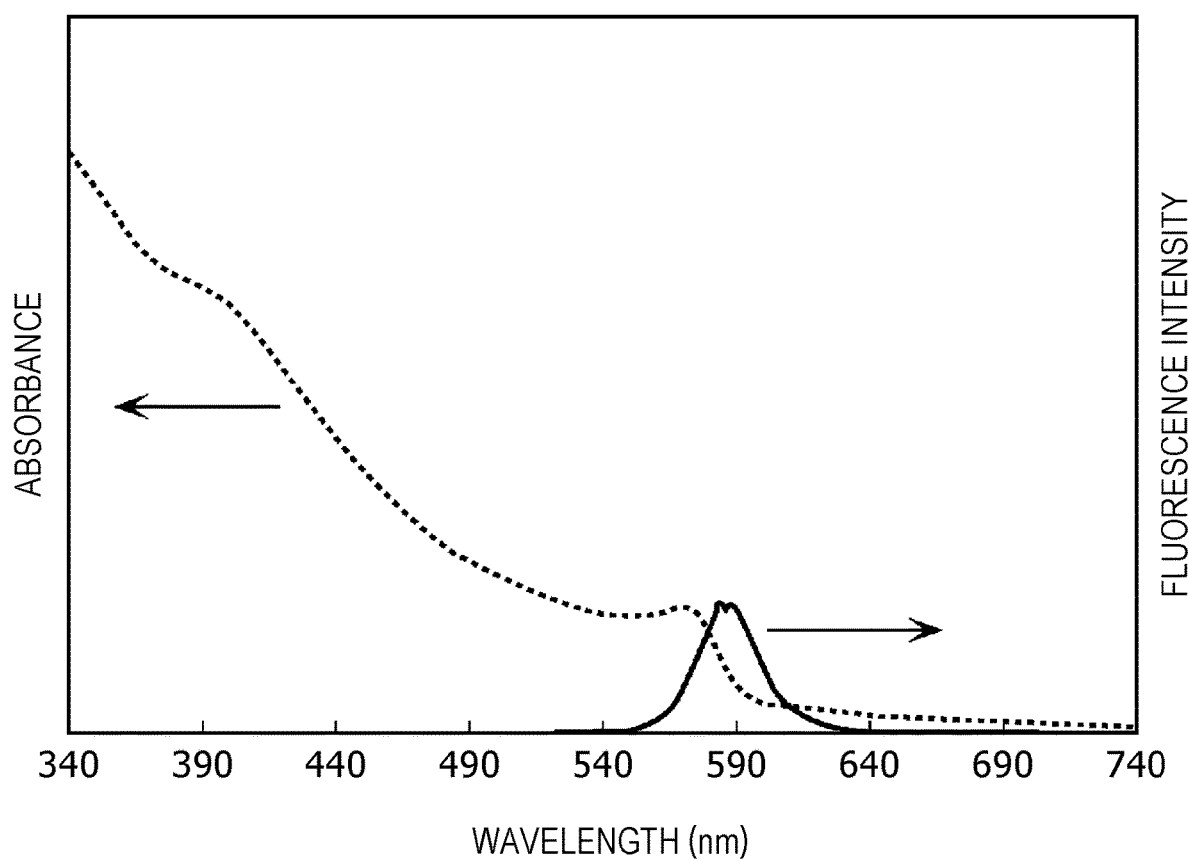
FIG. 3A is a graph showing the absorption spectrum and fluorescence spectrum of a $CsPbBr_2I$ thin film.

FIG. 3A is a graph showing the absorption spectrum and fluorescence spectrum of a $CsPbBr_2I$ thin film that is a perovskite material and is another example of the matrix material. As shown in FIG. 3A, the $CsPbBr_2I$ thin film absorbs light in the wavelength range of about 340 nm to about 600 nm and emits fluorescence in the wavelength range of about 560 nm to about 620 nm.

Figure 3B:
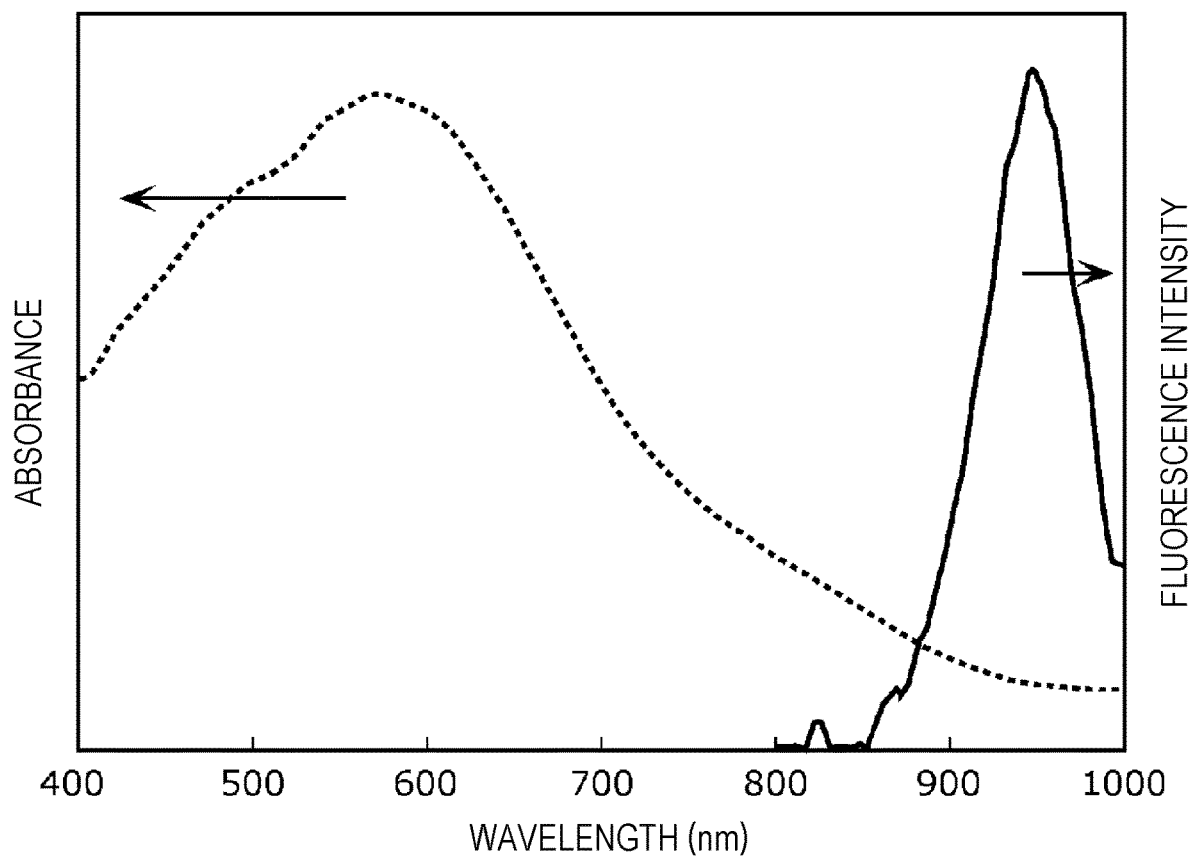
FIG. 3B is a graph showing the absorption spectrum and fluorescence spectrum of a $CsSnI_3$ thin film.

FIG. 3B is a graph showing the absorption spectrum and fluorescence spectrum of a $CsSnI_3$ thin film that is a perovskite material and is still another example of the matrix material. As shown in FIG. 3B, the $CsSnI_3$ thin film absorbs light in the wavelength range of about 400 nm to about 950 nm and emits fluorescence in the wavelength range of about 850 nm to about 1000 nm.

Figure 3C:
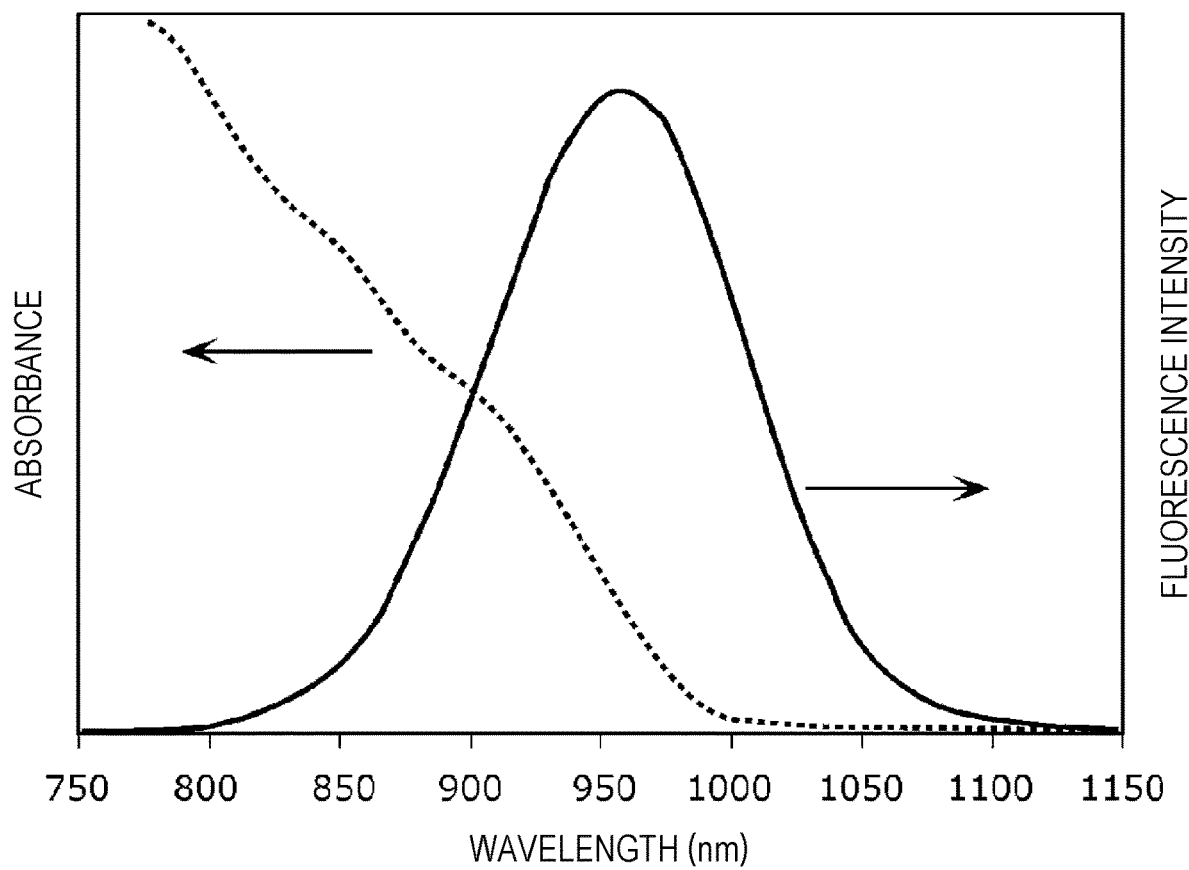
FIG. 3C is a graph showing the absorption spectrum and fluorescence spectrum of a $CH_3NH_3SnI_3$ thin film.

FIG. 3C is a graph showing the absorption spectrum and fluorescence spectrum of a $CH_3NH_3SnI_3$ thin film that is still another example of the matrix material. As shown in FIG. 3C, the $CH_3NH_3SnI_3$ thin film absorbs light in the wavelength range of about 1050 nm or shorter and emits fluorescence in the wavelength range of about 800 nm to about 1100 nm.

When the photoelectric conversion layer of the imaging device is irradiated with light, the semiconductor quantum dots absorb photons. The photons are converted to electric charges, and the electric charges are outputted to the outside as signal charges. When the photoelectric conversion layer contains the matrix material such as a semiconducting polymer or a perovskite material, the matrix material in the photoelectric conversion layer also absorbs photons and emits fluorescence isotropically. In this case, the fluorescence emitted from the matrix material in the photoelectric conversion layer is emitted also in directions different from the direction of the light applied to the imaging device. The fluorescence emitted from the matrix material is emitted from the photoelectric conversion layer isotropically. Therefore, in an imaging device including a photoelectric conversion layer disposed above a semiconductor substrate, a semiconductor layer in which charge storage regions, control circuits, etc. of the imaging device are formed can be irradiated with the fluorescence. For example, single-crystal silicon, which is the most commonly used material for the charge storage regions, the control circuits, etc., absorbs light in the wavelength range of about 200 nm to about 1100 nm. Therefore, when a semiconductor substrate containing silicon is used and irradiated with fluorescence in this wavelength range, the applied fluorescence may be absorbed by the charge storage regions and the control circuits in the semiconductor substrate. As shown in FIGS. 2, 3A, 3B, and 3C, the wavelengths of fluorescence emitted from the typical semiconducting polymer and perovskite materials fall substantially within the absorption wavelength range of the semiconductor layer. Moreover, when a π conjugated compound such as an acene or a thiophene compound is used as the ligand material, the same phenomenon may occur. Most of these π conjugated compounds used as the ligand material absorb light with a wavelength in the ultraviolet to visible range and emit fluorescence with a wavelength longer by several tens of nm to about 100 nm than the wavelength of the absorbed light, but this depends on the types of materials.

For example, single-crystal gallium arsenide often used as the material of the charge storage regions, the control circuits, etc. absorbs light in the wavelength range of about 200 nm to about 800 nm. Therefore, when a semiconductor substrate containing gallium arsenide is used and irradiated with fluorescence in this wavelength range, the applied fluorescence may be absorbed by the charge storage regions and the control circuits in the semiconductor substrate.

When the photons of the fluorescence are absorbed by the charge storage regions, electric charges are generated in the charge storage regions. The electric charges generated by absorption of the fluorescence cannot be distinguished from electric charges generated when the semiconductor quantum dots in the photoelectric conversion layer absorb photons entering from the outside. Particularly problematic is absorption of the photons of fluorescence generated from the π conjugated compound used as the ligand material or the matrix material in the photoelectric conversion layer in a certain pixel by the charge storage region in another pixel. In this case, signal charges are generated at a position different from the position irradiated with the light, and this causes image blurring, color mixing, noise, etc. This problem arises because light is emitted from the π conjugated compound used as the ligand material or the matrix material in the photoelectric conversion layer in directions different from the direction of the light applied to the imaging device. Absorption of the fluorescence emitted from the π conjugated compound used as the ligand material or the matrix material in the photoelectric conversion layer by the control circuits also causes malfunction of the circuits and an increase in noise.

As described above, the present inventor has found that, in the imaging device including the photoelectric conversion layer that is disposed above the semiconductor substrate and uses, as the photoelectric conversion material, the semiconductor quantum dots mixed with the π conjugated compound used as the ligand material or the matrix material, the fluorescence emitted from the π conjugated compound used as the ligand material or the matrix material can cause an increase in noise in the imaging device. Accordingly, the present disclosure provides an imaging device with reduced noise. The noise is reduced even when the imaging device includes a photoelectric conversion layer that is disposed above a semiconductor substrate and uses, as a photoelectric conversion material, semiconductor quantum dots mixed with a semiconductor quantum dot-coating material such as a π conjugated compound used as a ligand material or a matrix material.

Aspects of the present disclosure will be summarized below.

An imaging device according to one aspect of the present disclosure includes: a semiconductor substrate; a plurality of pixel electrodes located above the semiconductor substrate and each electrically connected to the semiconductor substrate; a counter electrode located above the plurality of pixel electrodes; a first photoelectric conversion layer located between the counter electrode and the plurality of pixel electrodes; and at least one first light-shielding body located in the first photoelectric conversion layer or above the first photoelectric conversion layer. The first photoelectric conversion layer contains semiconductor quantum dots having the property of absorbing light in a first wavelength range and a coating material that covers the semiconductor quantum dots and that has the property of absorbing light in a second wavelength range and emitting fluorescence in a third wavelength range. The at least one first light-shielding body absorbs or reflects light with a wavelength in at least part of the second wavelength range.

In this case, the first light-shielding body is located in the first photoelectric conversion layer or above the first photoelectric conversion layer. The phrase "the first light-shielding body is located above the first photoelectric conversion layer" means that the first light-shielding body is located above a first surface of the first photoelectric conversion layer having the first surface and a second surface opposite to the first surface, the first surface being closer to the counter electrode than to the plurality of pixel electrodes. The phrase "the first light-shielding body is located above the first photoelectric conversion layer" also means that the first light-shielding body is located in a region on the light incident side of the first photoelectric conversion layer, i.e., in a region on the side opposite to a region in which the semiconductor substrate is located, with the first photoelectric conversion layer interposed between the first light-shielding body and the semiconductor substrate. Therefore, the light in the second wavelength range is absorbed or reflected by the first light-shielding body before the light in the second wavelength range reaches the coating material. In this manner, the amount of the light in the second wavelength range that is absorbed by the coating material can be reduced, so that the amount of fluorescence emitted from the coating material can be reduced. Therefore, the noise generated by absorption of the fluorescence emitted from the coating material by charge storage regions or control circuits that are formed from impurity regions etc. of the semiconductor substrate can be reduced. Specifically, the light in the second wavelength range is a cause of the noise in the imaging device, and the first light-shielding body reduces the amount of the light in the second wavelength range that reaches the coating material. Therefore, the imaging device with reduced noise is obtained.

For example, the at least one first light-shielding body may include an optical filter that is located above the counter electrode and that absorbs or reflects the light with the wavelength in the at least part of the second wavelength range.

In this case, the optical filter is located above the first photoelectric conversion layer, i.e., on the light incident side of the first photoelectric conversion layer in the imaging device. Therefore, the optical filter absorbs or reflects at least part of the light in the second wavelength range before the light reaches the first photoelectric conversion layer. In this manner, the amount of the light in the second wavelength range that reaches the coating material can be efficiently reduced, so that the noise in the imaging device is reduced.

For example, the at least one first light-shielding body may include a first charge transport layer that is located between the first photoelectric conversion layer and the counter electrode and that absorbs the light with the wavelength in the at least part of the second wavelength range.

In this case, the first charge transport layer is located above the first photoelectric conversion layer, i.e., on the light incident side of the first photoelectric conversion layer in the imaging device. Therefore, the first charge transport layer absorbs at least part of the light in the second wavelength range before the light reaches the first photoelectric conversion layer. In this manner, the amount of the light in the second wavelength range that reaches the coating material can be efficiently reduced, so that the noise in the imaging device is reduced.

For example, the at least one first light-shielding body may include a second photoelectric conversion layer that is located between the first photoelectric conversion layer and the counter electrode and that absorbs the light with the wavelength in the at least part of the second wavelength range.

In this case, the second photoelectric conversion layer is located above the first photoelectric conversion layer, i.e., on the light incident side of the first photoelectric conversion layer in the imaging device. Therefore, the second photoelectric conversion layer absorbs at least part of the light in the second wavelength range before the light reaches the first photoelectric conversion layer. In this manner, the amount of the light in the second wavelength range that reaches the coating material can be efficiently reduced, so that the noise in the imaging device is reduced.

For example, the at least one first light-shielding body may contain a first material that differs from the semiconductor quantum dots and that absorbs the light with the wavelength in the at least part of the second wavelength range, and the first material may be located in the first photoelectric conversion layer.

In this case, since the first material is located in the first photoelectric conversion layer, the first material absorbs at least part of the light in the second wavelength range that has entered the first photoelectric conversion layer. Therefore, the amount of the light in the second wavelength range that reaches the coating material can be reduced, and the noise in the imaging device is reduced.

For example, the first light-shielding body may transmit light with a wavelength in at least part of the first wavelength range.

In this case, the light in the first wavelength range can easily reach the semiconductor quantum dots, and therefore a reduction in the photoelectric conversion function in the first photoelectric conversion layer can be prevented.

The at least one first light-shielding body may absorb or reflect light with a wavelength equal to or shorter than 1050 nm.

In this case, light in the near-infrared to visible wavelength range is absorbed or reflected by the first light-shielding body, and the light in the near-infrared to visible wavelength range is less likely to be absorbed by the coating material.

For example, the imaging device may further include at least one second light-shielding body that is located in the first photoelectric conversion layer or between the first photoelectric conversion layer and the plurality of pixel electrodes and that absorbs or reflects light with a wavelength in at least part of the third wavelength range.

In this case, the second light-shielding body is located in the first photoelectric conversion layer or between the first photoelectric conversion layer and the plurality of pixel electrodes. Therefore, even when the coating material emits the fluorescence in the third wavelength range, the second light-shielding body absorbs or reflects the light in the third wavelength range. In this manner, the amount of the light in the third wavelength range that reaches the charge storage regions or the control circuits that are formed from the impurity regions etc. of the semiconductor substrate can be reduced. Specifically, the first light-shielding body reduces the amount of the light in the second wavelength range that reaches the coating material, and the second light-shielding body reduces the amount of the light in the third wavelength range that reaches the charge storage regions or the control circuits formed from the impurity regions etc. of the semiconductor substrate and that causes noise in the imaging device. Therefore, the noise in the imaging device obtained is further reduced.

An imaging device according to another aspect of the present disclosure includes: a semiconductor substrate; a plurality of pixel electrodes located above the semiconductor substrate and each electrically connected to the semiconductor substrate; a counter electrode located above the plurality of pixel electrodes; a first photoelectric conversion layer located between the counter electrode and the plurality of pixel electrodes; and at least one second light-shielding body located in the first photoelectric conversion layer or between the first photoelectric conversion layer and the plurality of pixel electrodes. The first photoelectric conversion layer contains semiconductor quantum dots having the property of absorbing light in a first wavelength range and a coating material that covers the semiconductor quantum dots and that has the property of absorbing light in a second wavelength range and emitting fluorescence in a third wavelength range. The at least one second light-shielding body absorbs or reflects light with a wavelength in at least part of the third wavelength range.

In this case, the second light-shielding body is located in the first photoelectric conversion layer or between the first photoelectric conversion layer and the plurality of pixel electrodes. Therefore, even when the coating material emits the fluorescence in the third wavelength range, the second light-shielding body absorbs or reflects the light in the third wavelength range. In this manner, the amount of the light in the third wavelength range that reaches the charge storage regions or the control circuits that are formed from the impurity regions etc. of the semiconductor substrate can be reduced. Specifically, the light in the third wavelength range is a cause of the noise in the imaging device, and the second light-shielding body reduces the amount of the light in the third wavelength range that reaches the charge storage regions or the control circuits that are formed from the impurity regions etc. of the semiconductor substrate. Therefore, the noise in the imaging device obtained is reduced.

For example, the at least one second light-shielding body may contain a second material that differs from the semiconductor quantum dots and that absorbs the light with the wavelength in the at least part of the third wavelength range, and the second material may be located in the first photoelectric conversion layer.

In this case, since the second material is located in the first photoelectric conversion layer, the second material absorbs at least part of the fluorescence in the third wavelength range that is emitted from the coating material. Therefore, the amount of the light in the third wavelength range that reaches the charge storage regions or the control circuits that are formed from the impurity regions etc. of the semiconductor substrate can be reduced, so that the noise in the imaging device is reduced.

For example, the at least one second light-shielding body may include a second charge transport layer that is located between the first photoelectric conversion layer and the plurality of pixel electrodes and that absorbs the light with the wavelength in the at least part of the third wavelength range.

In this case, the second charge transport layer is located on the pixel electrode side of the first photoelectric conversion layer, i.e., on the semiconductor substrate side of the first photoelectric conversion layer. Therefore, the second charge transport layer absorbs at least part of the light in the third wavelength range before the light reaches the semiconductor substrate. In this manner, the amount of the light in the third wavelength range that reaches the charge storage regions or the control circuits that are formed from the impurity regions etc. of the semiconductor substrate can be reduced, and therefore the noise in the imaging device is reduced.

For example, the coating material may contain at least one selected from the group consisting of a matrix material and a π conjugated ligand material. The matrix material may contain at least one selected from the group consisting of a semiconducting polymer, a semiconducting copolymer, a semiconducting oligomer, a low-molecular weight semiconductor, a perovskite material, and a double perovskite material.

In this case, the electric conductivity of the first photoelectric conversion layer can be increased. Therefore, the efficiency for extracting signal charges from the first photoelectric conversion layer is increased.

For example, the first photoelectric conversion layer may further contain a third material that functions as an acceptor for the semiconductor quantum dots.

In this case, electrons in hole-electron pairs generated in the semiconductor quantum dots transfer to the acceptor material. Therefore, recombination of the hole-electron pairs is reduced, and the photoelectric conversion efficiency of the first photoelectric conversion layer is improved.

For example, the first photoelectric conversion layer may further contain a third material that functions as an acceptor for the semiconductor quantum dots and for the first material.

In this case, electrons in hole-electron pairs generated in the semiconductor quantum dots transfer to the acceptor material. Therefore, recombination of the hole-electron pairs is reduced, and the photoelectric conversion efficiency of the first photoelectric conversion layer is improved. Moreover, since electrons in hole-electron pairs generated by absorption of light by the first material transfer to the acceptor material, generation of energy by recombination of the hole-electron pairs is reduced.

For example, the first photoelectric conversion layer may further contain a third material that functions as an acceptor for the semiconductor quantum dots and for the second material.

In this case, electrons in hole-electron pairs generated in the semiconductor quantum dots transfer to the acceptor material. Therefore, recombination of the hole-electron pairs is reduced, and the photoelectric conversion efficiency of the first photoelectric conversion layer is improved. Moreover, since electrons in hole-electron pairs generated by absorption of light by the second material transfer to the acceptor material, generation of energy by recombination of the hole-electron pairs is reduced.

For example, the semiconductor substrate may contain silicon.

In this case, even when the imaging device uses the semiconductor substrate containing silicon that can easily absorb the fluorescence emitted from the coating material, the noise in the imaging device is reduced.

Embodiments of the present disclosure will next be described with reference to the drawings.

The embodiments described below show general or specific examples. Numerical values, shapes, materials, components, arrangements and connections of the components, steps, the order of the steps, etc. shown in the following embodiments are merely examples and are not intended to limit the present disclosure. Among the components in the following embodiments, components not described in an independent claim will be described as optional components.

In the present description, elements that are essential for the operation of the imaging device or effective in improving the characteristics thereof but are unnecessary for the description of the present disclosure are omitted. The drawings are schematic drawings, and scales, shapes, etc. are not taken into consideration at all. Therefore, the scales, for example, of the drawings are not necessarily the same. In the drawings, the same reference numerals are given to substantially the same components, and redundant description thereof will be omitted or simplified.

In the present description, terms, such as equal, representing the relation between elements, terms, such as square and circular, representing the shapes of elements, and numerical ranges do not represent only their strict meanings but are intended to include those in substantially the same range, e.g., with a few percent difference.

In the present description, the terms "above" and "below" do not refer to an upward direction (vertically above) and a downward direction (vertically below) in space recognition in an absolute manner but are used to define relative positional relations based on the stacking order in a stack structure. The terms "above" and "below" are used not only when two components are disposed with a space therebetween and another component is present between the two components but also when two components are disposed in contact with each other.

Embodiment 1

[Circuit Structure of Imaging Device]

First, the circuit structure of an imaging device according to an embodiment will be described using FIG. 4.

Figure 4:
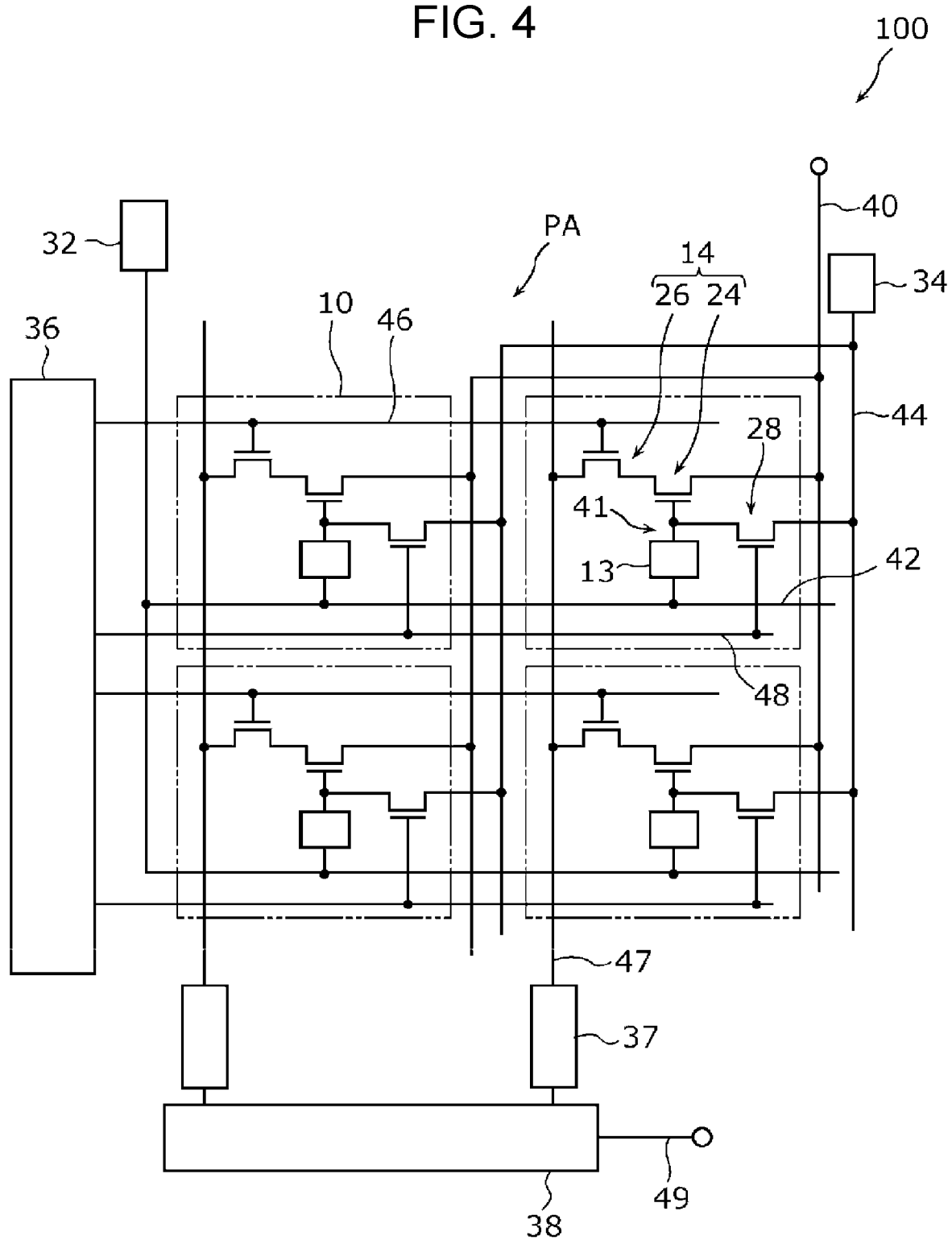
FIG. 4 is a circuit diagram showing an exemplary circuit structure of an imaging device according to embodiment 1.

FIG. 4 is a circuit diagram showing an exemplary circuit structure of the imaging device according to the present embodiment. The imaging device 100 shown in FIG. 4 includes a pixel array PA including a plurality of pixels 10 arranged two-dimensionally. FIG. 4 schematically shows an example in which the pixels 10 are arranged in a 2×2 matrix. The number of pixels 10 and the arrangement of the pixels 10 are not limited to those in the example shown in FIG. 4. For example, the imaging device 100 may be a line sensor including a plurality of pixels 10 arranged in a row.

Each of the pixels 10 includes a photoelectric conversion unit 13 and a signal detection circuit 14. The photoelectric conversion unit 13 generates a signal upon reception of incident light. It is unnecessary that the photoelectric conversion unit 13 be independent elements for the respective pixels 10, and a portion of the photoelectric conversion unit 13 may extend over a plurality of pixels 10. Each signal detection circuit 14 is a circuit that detects a signal generated by the photoelectric conversion unit 13. In this example, the signal detection circuit 14 includes a signal detection transistor 24 and an address transistor 26. The signal detection transistor 24 and the address transistor 26 are each typically a field-effect transistor (FET). In the present embodiment, an N channel MOSFET (Metal Oxide Semiconductor Field Effect Transistor) is exemplified as each of the signal detection transistor 24 and the address transistor 26. The transistors such as the signal detection transistor 24, the address transistor 26, and a reset transistor 28 described later each have a control terminal, an input terminal, and an output terminal. The control terminal is, for example, the gate. The input terminal is one of the drain and the source and is, for example, the drain. The output terminal is the other one of the drain and the source and is, for example, the source.

As schematically shown in FIG. 4, the control terminal of the signal detection transistor 24 is electrically connected to the photoelectric conversion unit 13. Signal charges generated by the photoelectric conversion unit 13 are stored in a charge storage node 41 between the gate of the signal detection transistor 24 and the photoelectric conversion unit 13. The signal charges are holes or electrons. The charge storage node is an example of a charge storage unit and is referred to as a "floating diffusion node." In the present description, the charge storage node is referred to also as a charge storage region. The details of the structure of the photoelectric conversion unit 13 will be described later.

In each pixel 10, a bias control line 42 is connected to the photoelectric conversion unit 13, and a prescribed voltage is applied to the photoelectric conversion unit 13. In the structure exemplified in FIG. 4, the bias control line 42 is connected to a voltage supply circuit 32.

Each pixel 10 is connected to a power line 40 that supplies a power voltage VDD. As shown in FIG. 4, the input terminal of the signal detection transistor 24 is connected to the power line 40. The power line 40 functions as a source follower power source, and the signal detection transistor 24 amplifies the signal generated by the photoelectric conversion unit 13 and outputs the amplified signal.

The input terminal of the address transistor 26 is connected to the output terminal of the signal detection transistor 24. The output terminal of the address transistor 26 is connected to one of a plurality of vertical signal lines 47 provided for respective rows of the pixel array PA. The control terminal of the address transistor 26 is connected to an address control line 46. By controlling the potential of the address control line 46, the output of the signal detection transistor 24 can be selectively read through the corresponding vertical signal line 47.

In the illustrated example, each address control line 46 is connected to a vertical scanning circuit 36. The vertical scanning circuit is referred to also as "column scanning circuit." The vertical scanning circuit 36 applies a prescribed voltage to each address control line 46 to select a plurality of pixels 10 arranged in a corresponding column. In this manner, signals from the selected pixels 10 are read, and the charge storage nodes 41 in the selected pixels 10 are reset.

The vertical signal lines 47 are main signal lines that transmit pixel signals from the pixel array PA to peripheral circuits. Column signal processing circuits 37 are connected to the vertical signal lines 47. The column signal processing circuits 37 are referred to also as "column signal storage circuits." The column signal processing circuits 37 perform noise limiting signal processing typified by correlated double sampling, analog-digital conversion, etc. As illustrated, the column signal processing circuits 37 are provided for their respective rows of the pixels 10 in the pixel array PA. A horizontal signal reading circuit 38 is connected to these column signal processing circuits 37. The horizontal signal reading circuit is referred to also as a "row scanning circuit." The horizontal signal reading circuit 38 reads signals from the plurality of column signal processing circuits 37 and outputs the signals to a horizontal common signal line 49 sequentially.

In the structure exemplified in FIG. 4, each pixel 10 includes a reset transistor 28. The reset transistor 28 is, for example, a field effect transistor, as are the signal detection transistor 24 and the address transistor 26. In an example described below, an N channel MOSFET is used as the reset transistor 28, unless otherwise specified. As illustrated, the reset transistor 28 is connected between a reset voltage line 44 that supplies a reset voltage Vr and the charge storage node 41. The control terminal of the reset transistor 28 is connected to a reset control line 48. By controlling the potential of the reset control line 48, the potential of the charge storage node 41 can be reset to the reset voltage Vr. In this example, the reset control line 48 is connected to the vertical scanning circuit 36. Therefore, when the vertical scanning circuit 36 applies a prescribed voltage to each reset control line 48, a plurality of pixels 10 disposed in a corresponding column can be reset.

In this example, the reset voltage lines 44 that supply the reset voltage Vr to the reset transistors 28 are connected to a reset voltage source 34. The reset voltage source is referred to also as a "reset voltage supply circuit." It is only necessary that the reset voltage source 34 have a structure that is capable of supplying the prescribed reset voltage Vr to the reset voltage lines 44 during operation of the imaging device 100, and the reset voltage source 34 is not limited to a specific power circuit, as is the voltage supply circuit 32 described above. The voltage supply circuit 32 and the reset voltage source 34 may each be part of a single voltage supply circuit or may be separate independent voltage supply circuits. One of or both the voltage supply circuit 32 and the reset voltage source 34 may be part of the vertical scanning circuit 36. Alternatively, the control voltage from the voltage supply circuit 32 and/or the reset voltage Vr from the reset voltage source 34 may be supplied to each pixel 10 through the vertical scanning circuit 36.

The power voltage VDD for the signal detection circuits 14 can be used as the reset voltage Vr. In this case, a common voltage source can be used as the reset voltage source 34 and a voltage supply circuit (not shown in FIG. 4) that supplies a power voltage to each pixel 10. In this case, since common lines can be used as the power lines 40 and the reset voltage lines 44, the wiring in the pixel array PA can be simplified. When different voltages are used as the reset voltage Vr and the power voltage VDD for the signal detection circuits 14, the imaging device 100 can be controlled more flexibly.

[Device Structure of Pixels]

Next, a cross-sectional structure of the plurality of pixels 10 of the imaging device 100 according to the present embodiment will be described using FIG. 5.

The imaging device 100 includes a first light-shielding body. The first light-shielding body absorbs or reflects light with wavelengths in at least part of the second wavelength range. The first light-shielding body is located in a first photoelectric conversion layer 15 or above the first photoelectric conversion layer 15. The details of the first light-shielding body will be described later using various examples.

Figure 5:
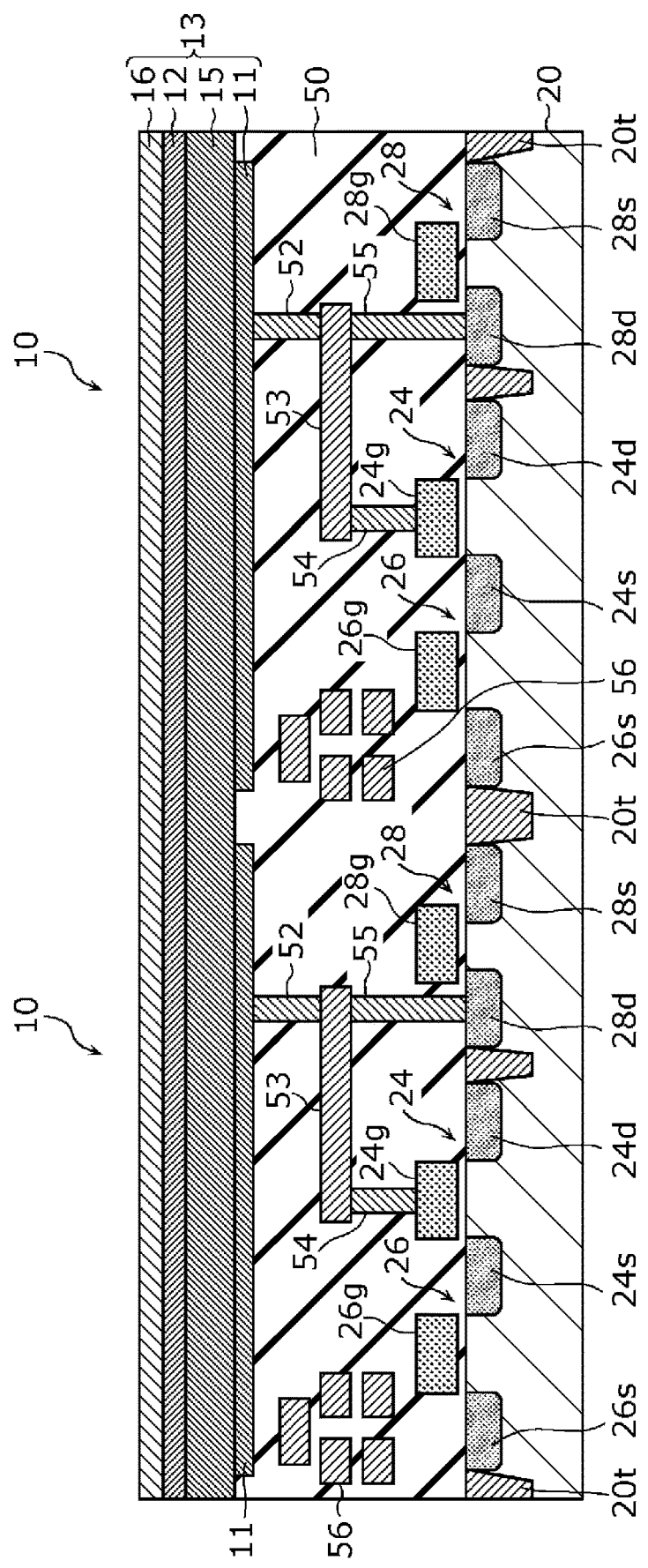
FIG. 5 is a schematic illustration showing a cross-sectional structure of a plurality of pixels in the imaging device according to embodiment 1.

FIG. 5 is a schematic cross-sectional view showing the cross-sectional structure of the plurality of pixels 10 of the imaging device 100 according to the present embodiment. The plurality of pixels 10 shown in FIG. 5 all have the same structure, but some of the plurality of pixels 10 may have a different structure. One pixel 10 of the plurality of pixels 10 will be described below. The imaging device 100 includes: a semiconductor substrate 20; a plurality of pixel electrodes 11 that are located above the semiconductor substrate 20 and each electrically connected to the semiconductor substrate 20; the counter electrode 12 located above the plurality of pixel electrodes 11; the first photoelectric conversion layer 15 located between the counter electrode 12 and the plurality of pixel electrodes 11; and an optical filter 16 located above the counter electrode 12. Light is incident on the pixels 10 from the upper side of the semiconductor substrate 20. The first light-shielding body in the present embodiment includes the optical filter 16.

In the structure exemplified in FIG. 5, the above-described signal detection transistors 24, the address transistors 26, and the reset transistors 28 are formed on the semiconductor substrate 20. The semiconductor substrate 20 is not limited to a substrate formed entirely of a semiconductor. The semiconductor substrate 20 may be, for example, an insulating substrate having a semiconductor layer formed on the surface on the side on which a photosensitive region is to be formed. The semiconductor substrate 20 used is, for example, a semiconductor substrate containing silicon. In the example described below, a P-type silicon (Si) substrate is used as the semiconductor substrate 20. The semiconductor substrate 20 is not limited to the semiconductor substrate containing silicon and may be a different semiconductor substrate such as a semiconductor substrate containing gallium arsenide.

The semiconductor substrate 20 includes impurity regions 26s, 24s, 24d, 28d, and 28s and element isolation regions 20t for electrically isolating the pixels 10 from each other. The impurity regions 26s, 24s, 24d, 28d, and 28s are N-type regions. An element isolation region 20t is provided also between each impurity region 24d and a corresponding impurity region 28d. The element isolation regions 20t are formed, for example, by injecting acceptor ions under prescribed conditions.

The impurity regions 26s, 24s, 24d, 28d, and 28s are, for example, an impurity diffusion layer formed in the semiconductor substrate 20. As schematically illustrated in FIG. 5, each signal detection transistor 24 includes an impurity region 24s, an impurity region 24d, and a gate electrode 24g. The gate electrode 24g is formed using a conductive material. The conductive material is, for example, polysilicon having electrical conductivity imparted by impurity doping but may be a metal material. The impurity region 24s functions as, for example, a source region of the signal detection transistor 24. The impurity region 24d functions as, for example, a drain region of the signal detection transistor 24. A channel region of the signal detection transistor 24 is formed between the impurity region 24s and the impurity region 24d.

Similarly, each address transistor 26 includes an impurity region 26s, an impurity region 24s, and a gate electrode 26g. The gate electrode 26g is formed using a conductive material. The conductive material is, for example, polysilicon having electrical conductivity imparted by impurity doping but may be a metal material. The gate electrode 26g is connected to an address control line 46 not shown in FIG. 5. In this example, the signal detection transistor 24 and the address transistor 26 share the impurity region 24s and are thereby electrically connected to each other. The impurity region 24s functions as, for example, a drain region of the address transistor 26. The impurity region 26s functions as, for example, a source region of the address transistor 26. The impurity region 26s is connected to a vertical signal line 47 not shown in FIG. 5. The impurity region 24s may not be shared by the signal detection transistor 24 and the address transistor 26. Specifically, the source region of the signal detection transistor 24 and the drain region of the address transistor 26 may be separated from each other in the semiconductor substrate 20 and may be electrically connected to each other through a wiring layer disposed in an interlayer insulating layer 50.

Each reset transistor 28 includes impurity regions 28d and 28s and a gate electrode 28g. The gate electrode 28g is formed using, for example, a conductive material. The conductive material is, for example, polysilicon having electrical conductivity imparted by impurity doping but may be a metal material. The gate electrode 28g is connected to a reset control line 48 not shown in FIG. 5. The impurity region 28s functions as, for example, a source region of the reset transistor 28. The impurity region 28s is connected to a reset voltage line 44 not shown in FIG. 5. The impurity region 28d functions as, for example, a drain region of the reset transistor 28.

The interlayer insulating layer 50 is disposed on the semiconductor substrate 20 so as to cover the signal detection transistors 24, the address transistors 26, and the reset transistors 28. The interlayer insulating layer 50 is formed of, for example, an insulating material such as silicon dioxide. As illustrated, a wiring layer 56 is disposed in the interlayer insulating layer 50. The wiring layer 56 is typically formed of a metal such as copper. The wiring layer 56 may include, as part thereof, signal lines such as the vertical signal lines 47 described above or power lines. The number of insulating layers in the interlayer insulating layer 50 and the number of layers included in the wiring layer 56 disposed in the interlayer insulating layer 50 can be freely set and are not limited to those in the example shown in FIG. 5.

As shown in FIG. 5, plugs 52, wiring lines 53, contact plugs 54, and contact plugs 55 are disposed in the interlayer insulating layer 50. The wiring lines 53 may be part of the wiring layer 56. The plugs 52, the wiring lines 53, the contact plugs 54, and the contact plugs 55 are each formed using a conductive material. For example, the plugs 52 and the wiring lines 53 are formed of a metal such as copper. The contact plugs 54 and 55 are formed, for example, of polysilicon having electrical conductivity imparted by impurity doping. The plugs 52, the wiring lines 53, the contact plugs 54, and the contact plugs 55 may be formed using the same material or may be formed using different materials.

The plugs 52, the wiring lines 53, and the contact plugs 54 form at least part of the charge storage nodes 41 between the photoelectric conversion unit 13 and the signal detection transistors 24. In the structure exemplified in FIG. 5, the gate electrode 24g of each signal detection transistor 24, a corresponding plug 52, a corresponding wiring line 53, a corresponding contact plug 54, a corresponding contact plug 55, and a corresponding impurity region 28d that is one of the source and drain regions of a corresponding reset transistor 28 function as a charge storage region for storing signal charges collected by a corresponding pixel electrode 11 in the photoelectric conversion unit 13.

Specifically, the pixel electrode 11 in the photoelectric conversion unit 13 is connected to the gate electrode 24g of the signal detection transistor 24 through the plug 52, the wiring line 53, and the contact plug 54. In other words, the gate of the signal detection transistor 24 is electrically connected to the pixel electrode 11. The pixel electrode 11 is also connected to the impurity region 28d through the plug 52, the wiring line 53, and the contact plug 55.

When signal charges are collected by the pixel electrode 11, a voltage corresponding to the amount of the signal charges stored in the charge storage region is applied to the gate of the signal detection transistor 24. The signal detection transistor 24 amplifies this voltage. The voltage amplified by the signal detection transistor 24 is selectively read as a signal voltage through the address transistor 26.

The photoelectric conversion unit 13 described above is disposed on the interlayer insulating layer 50. When the semiconductor substrate 20 is viewed in plan, the plurality of two-dimensionally arranged pixels 10 form a photosensitive region. The photosensitive region is referred to also as a pixel region. The distance between two adjacent pixels 10, i.e., the pixel pitch, may be, for example, about 2 μm.

[Structure of Photoelectric Conversion Unit]

A specific structure of the photoelectric conversion unit 13 will next be described.

As shown in FIG. 5, the photoelectric conversion unit 13 includes: the plurality of pixel electrodes 11, the counter electrode 12, and the first photoelectric conversion layer 15 disposed between the counter electrode 12 and the plurality of pixel electrodes 11. The optical filter 16 is disposed on the counter electrode 12 in the photoelectric conversion unit 13. In the present embodiment, the optical filter 16, the counter electrode 12, the first photoelectric conversion layer 15, and the plurality of pixel electrodes 11 are disposed in this order from the light incident side of the imaging device 100. Specifically, the optical filter 16 is disposed at a position closer to the counter electrode 12 than to the first photoelectric conversion layer 15, i.e., on the light incident side.

The photoelectric conversion unit 13 may further include other elements such as an electron blocking layer and a hole blocking layer.

In the example shown in FIG. 5, the counter electrode 12, the first photoelectric conversion layer 15, and the optical filter 16 are formed so as to extend over the plurality of pixels 10. The pixel electrodes 11 are provided for the respective pixels 10. Each pixel electrode 11 is spatially separated from the pixel electrode 11 of an adjacent pixel 10 and is thereby electrically isolated from the pixel electrode 11 of the adjacent pixel 10. At least one of the counter electrode 12, the first photoelectric conversion layer 15, or the optical filter 16 may be divided and disposed for each of the pixels 10.

The pixel electrodes 11 are electrodes for reading signal charges generated in the photoelectric conversion unit 13. At least one pixel electrode 11 is provided for each pixel 10. Each pixel electrode 11 is electrically connected to the gate electrode 24g of a corresponding signal detection transistor 24 and a corresponding impurity region 28d.

The pixel electrodes 11 are formed using a conductive material. The conductive material is, for example, a metal such as aluminum or copper, a metal nitride, or a polysilicon having electrical conductivity imparted by impurity doping.

The counter electrode 12 is, for example, a transparent electrode formed of a transparent conductive material. The counter electrode 12 is disposed on the light incident side of the first photoelectric conversion layer 15. Therefore, light passing through the counter electrode 12 is incident on the first photoelectric conversion layer 15. The light detected by the imaging device 100 is not limited to light in the wavelength range of visible light. For example, the imaging device 100 may detect infrared or ultraviolet light. The wavelength range of the visible light is, for example, equal to or longer than 380 nm and equal to or shorter than 780 nm.

The term "transparent" as used herein means that at least part of light in the wavelength range to be detected is allowed to pass through, and it is not essential that the light in the entire wavelength range of visible light be allowed to pass through. In the present description, electromagnetic waves in general including infrared light and ultraviolet light are referred to as "light" for convenience.

The counter electrode 12 is formed using a transparent conducting oxide (TCO) such as ITO, IZO, AZO, FTO, $SnO_2$, $TiO_2$, or ZnO. The voltage supply circuit 32 shown in FIG. 4 is connected to the counter electrode 12. By controlling the voltage applied to the counter electrode 12 from the voltage supply circuit 32, the potential difference between the counter electrode 12 and the pixel electrodes 11 can be set to a desired potential difference and maintained.

As described with reference to FIG. 4, the counter electrode 12 is connected to the bias control lines 42 connected to the voltage supply circuit 32. The counter electrode 12 is formed so as to extend over the plurality of pixels 10. Therefore, a desired control voltage can be applied to the plurality of pixels 10 simultaneously from the voltage supply circuit 32 through the bias control lines 42. Separate counter electrodes 12 may be provided for the respective pixels 10 so long as the desired control voltage can be applied from the voltage supply circuit 32.

The voltage supply circuit 32 controls the potential of the counter electrode 12 relative to the potential of the pixel electrodes 11, and this allows the pixel electrodes 11 to collect holes or electrons in hole-electron pairs generated in the first photoelectric conversion layer 15 as signal charges. When, for example, holes are used as the signal charges, the potential of the counter electrode 12 is set to be higher than the potential of the pixel electrodes 11, and this allows the pixel electrodes 11 to collect the holes selectively. In the following example, holes are used as the signal charges. Of course, electrons can be used as the signal charges. In this case, the potential of the counter electrode 12 is set to be lower than the potential of the pixel electrodes 11. When an appropriate bias voltage is applied between the counter electrode 12 and the pixel electrodes 11, the pixel electrodes 11 facing the counter electrode 12 collect positive or negative charges generated by photoelectric conversion in the first photoelectric conversion layer 15.

The first photoelectric conversion layer 15 is a layer that absorbs photons and generates photo-charges. Specifically, the first photoelectric conversion layer 15 generates hole-electron pairs upon reception of incident light. Therefore, the signal charges are holes or electrons. In the example described in the present embodiment, the signal charges are holes. However, the signal charges may be electrons. Holes serving as the signal charges are collected by the pixel electrodes 11. Electrons having a polarity opposite to the polarity of the signal charges are collected by the counter electrode 12.

The first photoelectric conversion layer 15 contains semiconductor quantum dots and a coating material covering the semiconductor quantum dots. The first photoelectric conversion layer 15 may further contain an acceptor material. The acceptor material is an example of the third material.

The semiconductor quantum dots generate hole-electron pairs, i.e., positive charges and negative charges, upon reception of incident light. The semiconductor quantum dots function as, for example, a donor for the acceptor material. Specifically, the semiconductor quantum dots donate electrons to the acceptor material. The semiconductor quantum dots may donate electrons to the pixel electrodes 11 or the counter electrode 12 not through the acceptor material.

The semiconductor quantum dots are a material having a three-dimensional quantum confinement effect. The semiconductor quantum dots are nanocrystals having a diameter of about 2 nm to about 10 nm and composed of several tens of atoms. Examples of the material of the semiconductor quantum dots include group IV semiconductors such as Si and Ge, group IV-VI semiconductors such as PbS, Pb Se, and PbTe, group III-V semiconductors such as InAs and InSb, and ternary mixed crystals such as HgCdTe and PbSnTe.

Figure 6:
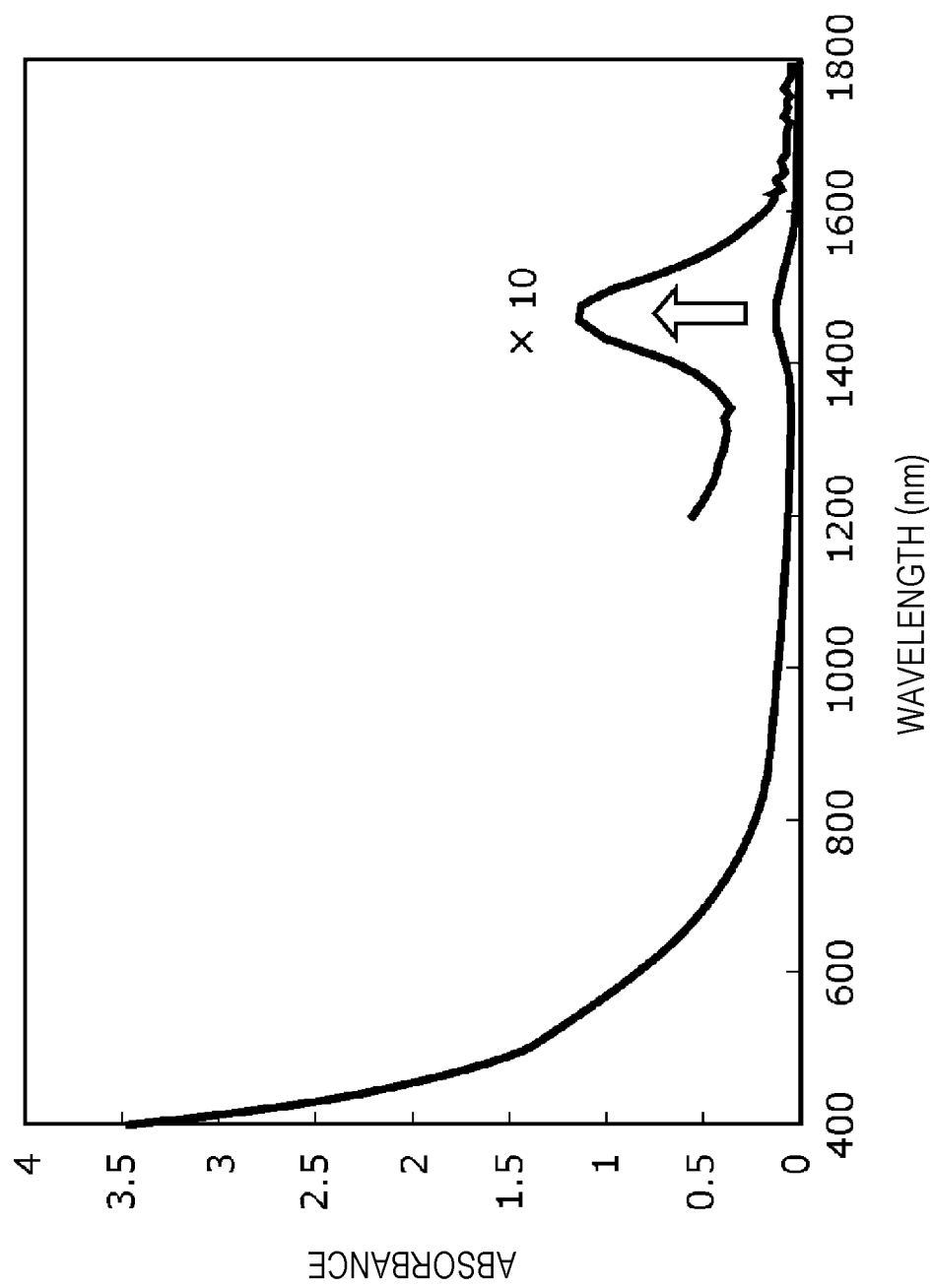
FIG. 6 is a graph showing an example of the absorption spectrum of semiconductor quantum dots.

The semiconductor quantum dots have the property of absorbing light in the first wavelength range. FIG. 6 is a graph showing an example of the absorption spectrum of the semiconductor quantum dots. The absorption spectrum shown in FIG. 6 is the absorption spectrum of semiconductor quantum dots which have a particle diameter of about 5 nm and in which the material of the core is PbS. FIG. 6 also shows a spectrum obtained by enlarging a region extending from 1200 nm to 1800 nm by a factor of 10. As shown in FIG. 6, the semiconductor quantum dots have a light absorption peak. In the example shown in FIG. 6, the wavelength of the absorption peak of the semiconductor quantum dots is in the infrared wavelength range. The light absorption peak wavelength of the semiconductor quantum dots is derived from the energy gap of the semiconductor quantum dots and can be controlled by changing the core material of the semiconductor quantum dots and their particle diameter.

The first wavelength range is a wavelength range in which the semiconductor quantum dots absorb light and generate electric charges, as at the light absorption peak wavelength shown in FIG. 6. Specifically, the first wavelength range is a wavelength range in which the semiconductor quantum dots exhibit significant quantum efficiency. For example, the first wavelength range is a wavelength range in which the light absorptance of the semiconductor quantum dots is equal to or more than 1%.

As described above, the semiconductor quantum dots exhibit a light absorption peak in a specific narrow wavelength range, and therefore the first photoelectric conversion layer 15 using the semiconductor quantum dots allows narrow wavelength band imaging to be achieved. In particular, when the semiconductor quantum dots exhibit light absorption in a narrow wavelength range in the infrared wavelength region, high sensitivity imaging using infrared wavelengths can be performed. The semiconductor quantum dots that exhibit a light absorption peak in the infrared wavelength range are, for example, semiconductor quantum dots in which the material of the core is PbS, Pb Se, PbTe, InAs, InSb, $Ag_2S$, $Ag_2Se$, $Ag_2Te$, CuS, $CuInS_2$, $CuInSe_2$, $AgInS_2$, $AgInSe_2$, $AgInTe_2$, $ZnSnAs_2$, $ZnSnSb_2$, $CdGeAs_2$, $CdSnAs_2$, HgCdTe, or InGaAs.

Figure 7:
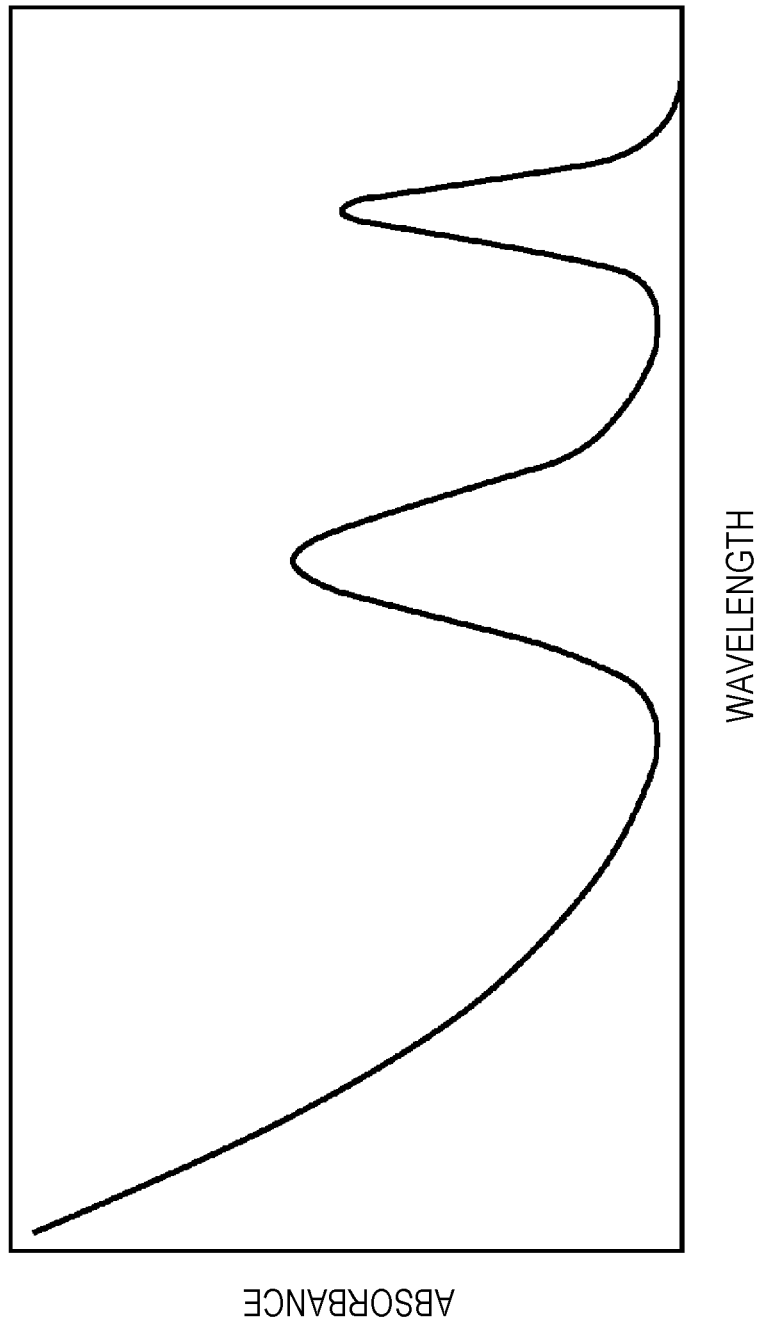
FIG. 7 is a schematic illustration of an example of the absorption spectrum of semiconductor quantum dots including a plurality of types of semiconductor quantum dots.

The first photoelectric conversion layer 15 may contain a plurality of types of semiconductor quantum dots with different particle diameters and/or a plurality of types of semiconductor quantum dots with different core materials. FIG. 7 is a schematic illustration showing an example of the absorption spectrum of semiconductor quantum dots including a plurality of types of semiconductor quantum dots. As shown in FIG. 7, the semiconductor quantum dots including a plurality of types of semiconductor quantum dots with different particle diameters and/or a plurality of types of semiconductor quantum dots with different core materials have a plurality of absorption peaks.

The first photoelectric conversion layer 15 may contain a material that functions as a donor for the acceptor material, in addition to the semiconductor quantum dots.

The acceptor material functions as an acceptor for the semiconductor quantum dots. The acceptor material is, for example, an electron acceptor material that accepts electrons from the semiconductor quantum dots. Therefore, electrons transfer from hole-electron pairs generated in the semiconductor quantum dots to the acceptor material. In this case, recombination of the hole-electron pairs is reduced, and the photoelectric conversion efficiency of the first photoelectric conversion layer 15 is improved.

Examples of the acceptor material used include: C60 (fullerene); C60 derivatives such as PCBM (phenyl-$C_{61}$-butyric acid methyl ester) and ICBA (indene C60 bisadduct); and oxide semiconductors such as $TiO_2$, ZnO, and $SnO_2$. The acceptor material is not limited to these materials, and any material capable of accepting electrons from the semiconductor quantum dots as described above can be used as the acceptor material. One acceptor material may be used, or a combination of a plurality of acceptor materials may be used.

The coating material is a material used to cover the semiconductor quantum dots in order to prevent the formation of secondary particles of the semiconductor quantum dots, stabilize the film quality, and improve the electrical conduction between the semiconductor quantum dots. The coating material has the property of absorbing light in the second wavelength range and emitting fluorescence in the third wavelength range. The coating material contains, for example, at least any of the ligand material and the matrix material.

The second wavelength range is a wavelength range in which the coating material exhibits significant absorption. Specifically, the second wavelength range is a wavelength range of light absorbed by the coating material in which the coating material absorbs light and emits fluorescence to the extent that the operation of the imaging device 100 is affected to cause image blurring, color mixing noise, malfunctions, etc. For example, the second wavelength range is a wavelength range in which the light absorptance of the coating material is equal to or more than 1%. The second wavelength range depends, for example, on the type of coating material, the probability of fluorescence emission, the thickness of the first photoelectric conversion layer 15, the imaging purpose of the image sensor, the imaging environment, etc.

The third wavelength range is the wavelength range of fluorescence emitted when the coating material absorbs light in the second wavelength range. When the coating material is P3HT, which is an example of the matrix material, the coating material emits significant fluorescence when it absorbs light in the wavelength range of about 400 nm to about 650 nm as shown in FIG. 2.

The matrix material is a material that fills the space between the plurality of semiconductor quantum dots in the first photoelectric conversion layer 15 to cover the semiconductor quantum dots to thereby improve the electrical conduction in the first photoelectric conversion layer 15.

The matrix material is a material containing, for example, at least one of semiconducting polymers, semiconducting copolymers, semiconducting oligomers, low-molecular weight semiconductors, perovskite materials, and double perovskite materials. When any of these materials is contained in the matrix material, the electrical conductivity between the semiconductor quantum dots is improved, and the electrical conduction in the first photoelectric conversion layer 15 is improved. Moreover, the first photoelectric conversion layer 15 formed can have good film quality.

Examples of the semiconducting polymers and the semiconducting oligomers that can be used include π electron conjugated semiconducting oligomers and polymers having a planar monomer skeleton such as polymers of fluorene, fluorene derivatives, thiophene, thiophene derivatives, and phenylenevinylene derivatives. The semiconducting polymer used may be a semiconducting copolymer including any of the above monomers in an amount equal to or more than 50%. Specific examples of the semiconducting polymer and the semiconducting copolymer include P3HT, PFO (polyfluorene), PFO-BT (poly(fluorene-benzothiadiazole)), PT (polythiophene), and MDMO-PPV (poly[2-methoxy-5-(3',7'-dimethyloctyloxy)-1,4-phenylenevinylene]).

The low-molecular weight semiconductor is, for example, a low-molecular weight organic semiconductor soluble in a solvent for the semiconductor quantum dots.

The perovskite material is an inorganic perovskite compound such as $CsPbBr_2I$ or $CsSnI_3$. The perovskite material may be an organic-inorganic perovskite compound such as $CH_3NH_3SnI_3$.

The double perovskite material is, for example, an inorganic double perovskite compound. The double perovskite material may be an organic-inorganic double perovskite compound.

The ligand material is surface modification groups that modify the surface of the semiconductor quantum dots to cover the semiconductor quantum dots. The ligand material is, for example, a π conjugated ligand material. In this case, the electrical conductivity between the semiconductor quantum dots is improved, and the electrical conduction in the first photoelectric conversion layer 15 is improved. Moreover, the formation of secondary particles of the semiconductor quantum dots can be prevented.

Specific examples of the π conjugated ligand material used include an organic molecule having a π conjugated molecular skeleton such as a polyacene skeleton or a thiophene derivative skeleton and having at least one terminal group such as a thiol group, a carboxyl group, or an amino group that adsorbs to an atom on the surface of the semiconductor quantum dots.

The optical filter 16 has a non-zero light reflectance or a non-zero light absorptance at wavelengths in at least part of the second wavelength range in which the coating material exhibits significant absorption. For example, the optical filter 16 has a non-zero light reflectance or a non-zero light absorptance at wavelengths including a wavelength at which the coating material exhibits the maximum light absorptance within the second wavelength range. For example, the optical filter 16 has a non-zero light reflectance or a non-zero light absorptance at all the wavelengths in the second wavelength range.

The optical filter 16 reflects or absorbs light in the second wavelength range to reduce the transmittance of light in the second wavelength range. In this manner, the amount of light absorbed by the coating material is reduced, and the amount of fluorescence emitted from the coating material is reduced.

For example, the optical filter 16 transmits substantially no light in the second wavelength range. The phrase "transmit substantially no light in the second wavelength range" means as follows. In the case where light passing through the optical filter 16 is absorbed by the coating material and the coating material emits fluorescence, although the fluorescence is absorbed by the charge storage regions, significant false signals are not generated, or the fluorescence does not cause a significant malfunction of the control circuits.

For example, the optical filter 16 absorbs or reflects light with a wavelength equal to or shorter than 1050 nm. In this case, light in the near-infrared to visible wavelength range is less likely to be absorbed by the coating material. Moreover, the optical filter 16 may absorb or reflect light with a wavelength equal to or shorter than 700 nm.

The transmittance of light in the second wavelength range through the optical filter 16 depends on the absorption coefficient of the coating material, the probability of fluorescence emission, the thickness of the first photoelectric conversion layer 15, the purpose of imaging by the imaging device 100, the imaging environment, etc. For example, the transmittance is set such that the light absorptance of the coating material is equal to or less than 1% at all the wavelengths in the second wavelength range. Specifically, the transmittance of light in the second wavelength range through the optical filter 16 may be, for example, equal to or less than 5% or may be equal to or less than 1%.

As described above, the optical filter 16 is located on the light incident side of the first photoelectric conversion layer 15 in the imaging device and absorbs or reflects at least part of light in the second wavelength range. This can reduce the amount of light in the second wavelength range that reaches the coating material. Therefore, the amount of fluorescence generated when the coating material is excited by the light in the second wavelength range can be reduced. Specifically, noise etc. that are generated when the charge storage regions etc. absorb fluorescence emitted from the coating material can be reduced.

The optical filter 16 transmits light with wavelengths in at least part of the first wavelength range. In other words, the optical filter 16 has significant transparency at light wavelengths in at least part of the first wavelength range. The phrase "significant transparency" means the transparency that allows imaging using light passing through the optical filter 16 and photoelectrically converted by the semiconductor quantum dots. The transmittance of light in the first wavelength range through the optical filter 16 depends on imaging conditions, the purpose of imaging, etc. and is, for example, equal to or more than 50%.

When the semiconductor quantum dots in the first photoelectric conversion layer 15 include a plurality of types of semiconductor quantum dots having different particle diameters and/or a plurality of types of semiconductor quantum dots with different core materials as shown in FIG. 7, the optical filter 16 may have significant transparency in a wavelength range including any of the light absorption peak wavelengths of these types of semiconductor quantum dots.

As described above, the optical filter 16 transmits light with wavelengths in at least part of the first wavelength range, and therefore a reduction in the photoelectric conversion function in the first photoelectric conversion layer 15 can be prevented.

The optical filter 16 may be an absorption type filter using, for example, colored glass or may be a reflection type filter obtained by stacking a dielectric multilayer film.

Examples of the absorption type filter include colored glass RG715 manufactured by SCHOTT. The colored glass RG715 has the property of blocking light with wavelengths equal to or shorter than 700 nm and allowing light with wavelengths equal to or longer than 800 nm to pass through. For example, when the colored glass RG715 is used as the optical filter 16, the optical filter 16 can transmit light with a light absorption peak wavelength of semiconductor quantum dots having an energy gap in the infrared region.

When the colored glass RG715 is used as the optical filter 16, the optical filter 16 transmits substantially no light in the second wavelength range when the upper limit of the second wavelength range of the matrix material is equal to or less than 700 nm as in the case of P3HT or $CsPbBr_2I$.

The above are merely examples, and an optical filter having characteristics appropriate for the absorption spectrum of the coating material and the absorption spectrum of the semiconductor quantum dots may be selected.

The optical filter 16 may be, for example, a long pass filter that blocks light with wavelengths shorter than a certain wavelength and transmits light with wavelengths longer than the certain wavelength or may be a band pass filter that transmits only light in a certain wavelength range and blocks light with wavelengths shorter and longer than the certain wavelength range. For example, the transmission wavelength range of the band pass filter may be substantially the same as the light absorption peak wavelength of the semiconductor quantum dots.

The optical filter 16 may be, for example, a notch filter that blocks light in a wavelength range including the second wavelength range and transmits light with wavelengths shorter than the above wavelength range and light with wavelengths longer than the above wavelength range.

The optical filter 16 may be disposed immediately above the counter electrode 12 as shown in FIG. 5, may be disposed on a sealing film formed on the counter electrode 12 and not shown in FIG. 5, or may be disposed on glass attached to protect the imaging surface of the imaging device 100 and not shown in FIG. 5.

It is unnecessary that the optical filter 16 be disposed near the photoelectric conversion unit 13, and the optical filter 16 may be disposed in an optical path of the imaging system. For example, the optical filter 16 may be disposed between an imaging lens and the photoelectric conversion unit 13, in the imaging lens, or in front of the imaging lens.

The optical filter 16 may have the function of a sealing film for preventing transmission of oxygen and water vapor.

The optical filter 16 may be used together with, for example, an optical filter for multispectral imaging that is used to change imaging spectra for pixels. The optical filter for multispectral imaging may serve as the optical filter 16.

The optical filter 16 is not limited to a fixed filter. For example, the optical filter 16 may be replaceable with another optical filter, if necessary.

Embodiment 2

Next, embodiment 2 will be described. Embodiment 2 differs from embodiment 1 in that a first charge transport layer instead of the optical filter is used as the first light-shielding body. The difference from embodiment 1 will be mainly described, and the description of common features will be omitted or simplified.

[Structure of Photoelectric Conversion Unit]

Figure 8:
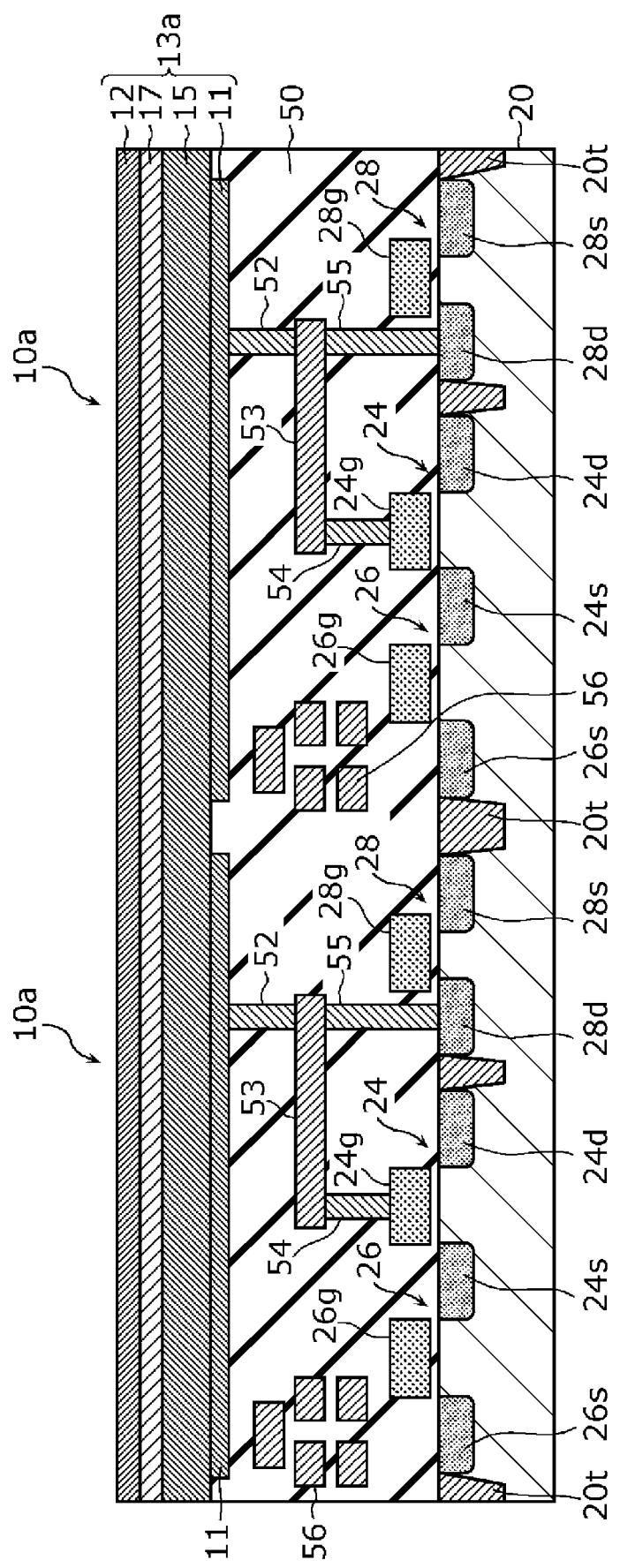
FIG. 8 is a schematic illustration showing a cross-sectional structure of a plurality of pixels in an imaging device according to embodiment 2.

FIG. 8 is a schematic cross-sectional view showing a cross-sectional structure of a plurality of pixels 10a in an imaging device 100 according to the present embodiment. As shown in FIG. 8, the pixels 10a differs from the pixels 10 in embodiment 1 in that the optical filter 16 is not provided and that a photoelectric conversion unit 13a is provided instead of the photoelectric conversion unit 13.

The photoelectric conversion unit 13a includes: the plurality of pixel electrodes 11; the counter electrode 12; the first photoelectric conversion layer 15 located between the counter electrode 12 and the plurality of pixel electrodes 11; and the first charge transport layer 17 located between the counter electrode 12 and the first photoelectric conversion layer 15. In the present embodiment, the counter electrode 12, the first charge transport layer 17, the first photoelectric conversion layer 15, and the plurality of pixel electrodes 11 are disposed in this order from the light incident side of the imaging device 100. Specifically, the first charge transport layer 17 is disposed on the light incident side of the first photoelectric conversion layer 15. The first light-shielding body in the present embodiment includes the first charge transport layer 17.

As shown in FIG. 8, the first charge transport layer 17 is disposed in contact with the first photoelectric conversion layer 15 and with the counter electrode 12. The first charge transport layer 17 has the function of transporting charges to be collected by the counter electrode 12 among positive and negative charges generated in the first photoelectric conversion layer 15.

The first charge transport layer 17 has a non-zero light absorptance at wavelengths in at least part of the second wavelength range. For example, the first charge transport layer 17 has a non-zero light absorptance at wavelengths including a wavelength at which the coating material exhibits the maximum light absorptance within the second wavelength range. For example, the first charge transport layer 17 has a non-zero light absorptance at all the wavelengths in the second wavelength range. For example, the first charge transport layer 17 transmits substantially no light in the second wavelength range.

For example, the first charge transport layer 17 absorbs light with a wavelength equal to or shorter than 1050 nm. In this case, light in the infrared to visible wavelength range is less likely to be absorbed by the coating material. Moreover, the first charge transport layer 17 may absorbs light with a wavelength equal to or shorter than 700 nm.

The first charge transport layer 17 has significant light transparency in at least part of the first wavelength range. When the first photoelectric conversion layer 15 containing the semiconductor quantum dots has a plurality of light absorption peak wavelengths, the first charge transport layer 17 may have significant transparency at any of the light absorption peak wavelengths of the semiconductor quantum dots.

The light transmittance of the first charge transport layer 17 depends on the light absorption coefficient of the material forming the first charge transport layer 17 and the thickness of the first charge transport layer 17.

The transmittance of light in the second wavelength range through the first charge transport layer 17 is, for example, equal to or less than 5% or may be equal to or less than 1%.

No particular limitation is imposed on the charge transport material in the first charge transport layer 17 so long as it has the light transmittance described above. Examples of the charge transport material in the first charge transport layer 17 include fullerenes, fullerene derivatives such as PCBM, perylene derivatives such as PTCDA and PTCBI, and non-fullerene-based low-bandgap organic semiconductors represented by structural formula (1) below such as BT-CIC and represented by structural formula (2) below such as $CO_i8DFIC$. The lowest unoccupied molecular orbital levels of these materials relative to the vacuum level are relatively deep, and these materials tend to accept electrons from the semiconductor quantum dots at the contact interfaces with the semiconductor quantum dots. When the first charge transport layer 17 is designed to transport negative charges, i.e., electrons, as described above, a material having the above-described light transmittance is selected as the charge transport material in the first charge transport layer 17 from among materials whose lowest unoccupied molecular orbital level or conduction band lower edge level is deeper than the lowest unoccupied molecular orbital level of the semiconductor quantum dots used. In contrast, when the first charge transport layer 17 is designed to transport positive charges, i.e., holes, a material having the above-described light transmittance is selected as the charge transport material in the first charge transport layer 17 from among materials whose highest occupied molecular orbital level or conduction band upper edge level is shallower than the highest occupied molecular orbital level of the semiconductor quantum dots used.

Figure 9:
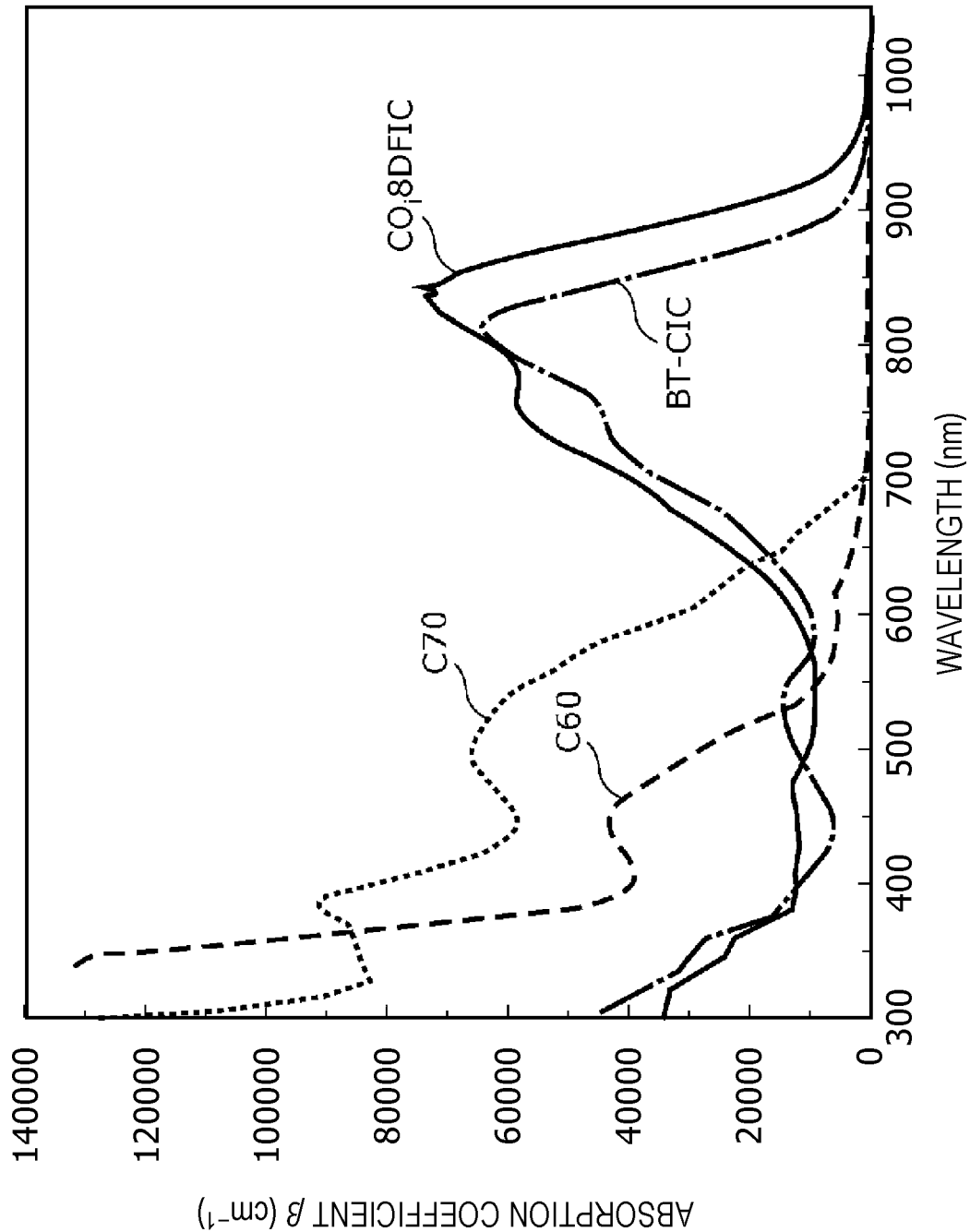
FIG. 9 is a graph showing the absorption spectra of C60, C70, BT-CIC, and $CO_68DFIC$ thin films.

The transmittance of the first charge transport layer 17 will be described using C70 having negative charge transportability as an example. FIG. 9 is a graph showing the absorption spectra of C60, C70, BT-CIC, and $CO_i8DFIC$.

As shown in FIG. 9, C60 easily absorbs light in the wavelength range of about 550 nm or shorter. C70 easily absorbs light in the wavelength range of about 700 nm or shorter. BT-CIC easily absorbs light in the wavelength range of from 600 nm to 950 nm. $CO_i8DFIC$ easily absorbs light in the wavelength range of from 600 nm to 1000 nm.

Figure 10:
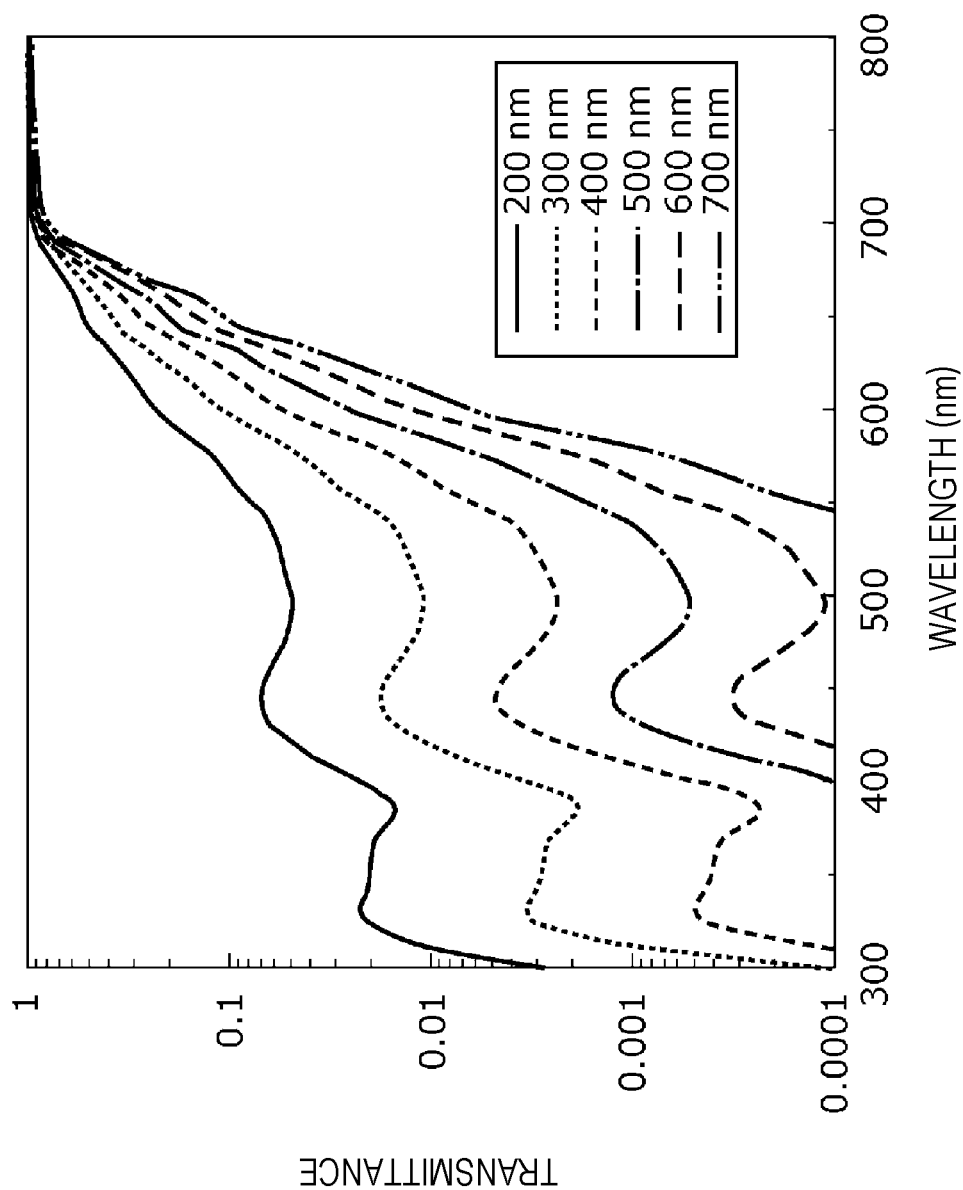
FIG. 10 is a graph showing the results of simulations of the light transmittances of C70 layers having different thicknesses.

FIG. 10 is a graph showing the results of simulations of the light transmittance of C70 layers with different thicknesses. In the transmittance simulation results shown in FIG. 10, the vertical axis represents transmittance, and the horizontal axis represents wavelength. In FIG. 10, the transmittance is 1 when the entire amount of light at a wavelength on the horizontal axis is transmitted. For example, when the transmittance is converted to a percentage, 1 is 100%, and 0.01 is 1%. In FIG. 10, the vertical axis represents the common logarithm of the transmittance.

As shown in FIG. 10, the transmittances of light with a wavelength equal to or shorter than 600 nm through the C70 layers with a thickness equal to or more than 400 nm are equal to or less than 5%, and the transmittances of light with a wavelength equal to or shorter than 600 nm through the C70 layers with a thickness equal to or more than 600 nm are equal to or less than 1%. C70 has the function of transporting negative charges. Therefore, in the imaging device 100 in which the counter electrode 12 collects negative charges, the C70 layer functions as a charge transport layer and also has

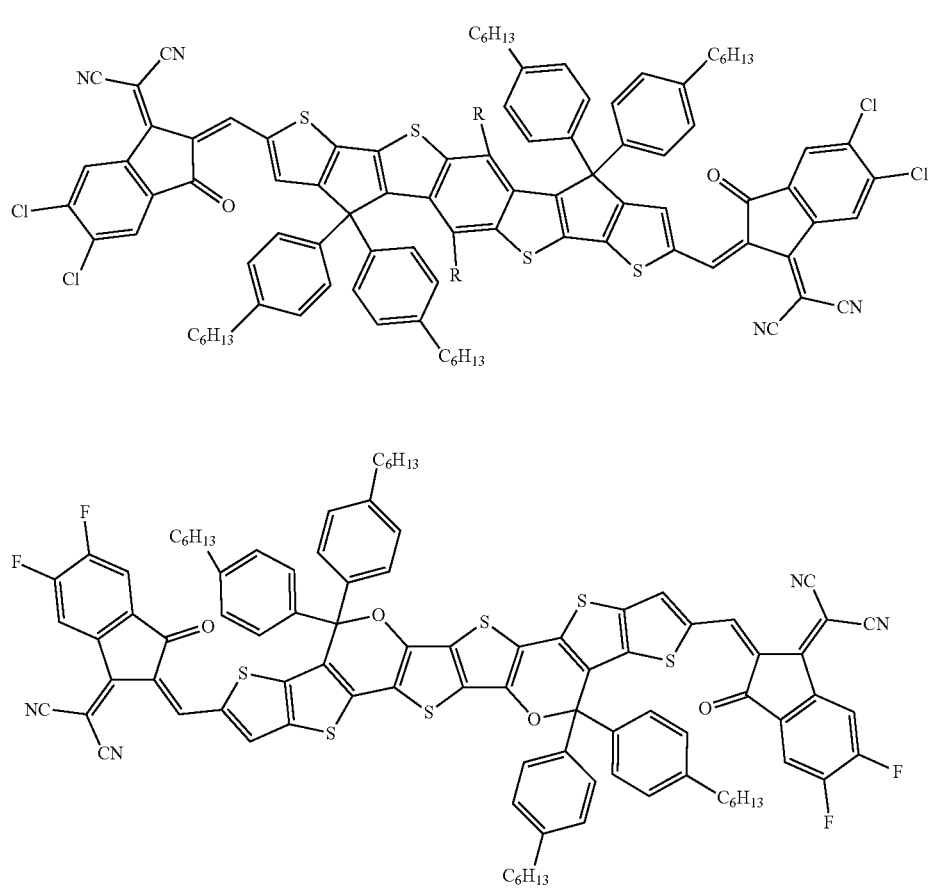

the function of reducing the ratio of light having a wavelength equal to or shorter than 600 nm and reaching the first photoelectric conversion layer 15. Therefore, when the matrix material is $CsPbBr_2I$ that is a perovskite material, the transmittance in the absorption wavelength range of the matrix material can be reduced, and the emission of fluorescence that causes noise can be reduced.

As described above, from the viewpoint of reducing the transmittance of light in the second wavelength range, the thickness of the first charge transport layer 17 is, for example, equal to or more than 400 nm and may be equal to or more than 600 nm.

Figure 11:
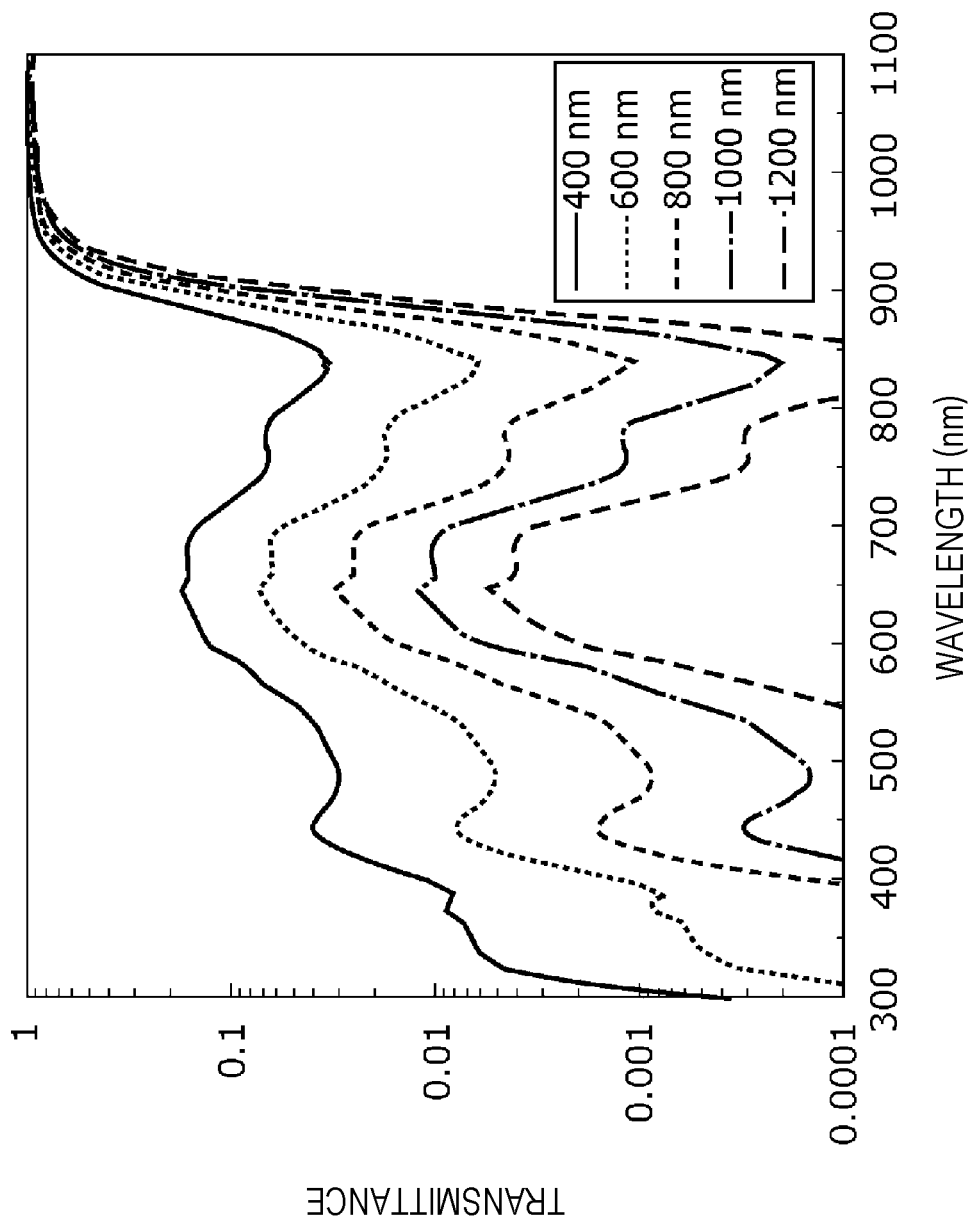
FIG. 11 is a graph showing the results of simulations of the light transmittances of $CO_68DFIC$/C70 mixture layers with different thicknesses.

The first charge transport layer 17 may be composed of one material or may be composed of a plurality of materials. For example, a mixture of a plurality of materials having different absorption spectra allows the light transmittance to be reduced in a wider wavelength range. For example, when the first charge transport layer 17 is formed as a mixture layer including $CO_i8DFIC$ having a large absorption coefficient in the wavelength range of from 600 nm to 1000 nm and C70 having a large absorption coefficient in the wavelength range of 700 nm or shorter, the light transmittance can be reduced in a wider wavelength range than that when the first charge transport layer 17 is formed only of C70. FIG. 11 is a graph showing the results of simulations of the light transmittances of $CO_i8DFIC/C70$ mixture layers having different thicknesses. FIG. 11 shows the results for the mixture layers when $CO_i8DFIC$ and C70 are mixed at a ratio of 1:1. As shown in FIG. 11, when the thickness of the mixture layer is 1000 nm or more, the transmittance of light with a wavelength equal to or shorter than 900 nm can be equal to or less than 1%.

The first charge transport layer 17 may be formed of a mixture of the charge transport material and a non-charge transport material. For example, a material having the function of transporting charges may be selected as the charge transport material, and a material having a desired absorption spectrum, e.g., absorbing light in the second wavelength range, may be selected as the non-charge transport material.

Embodiment 3

Next, embodiment 3 will be described. Embodiment 3 differs from embodiment 1 in that a second photoelectric conversion layer instead of the optical filter is used as the first light-shielding body. The difference from embodiment 1 will be mainly described, and the description of common features will be omitted or simplified.

[Structure of Photoelectric Conversion Unit]

Figure 12:
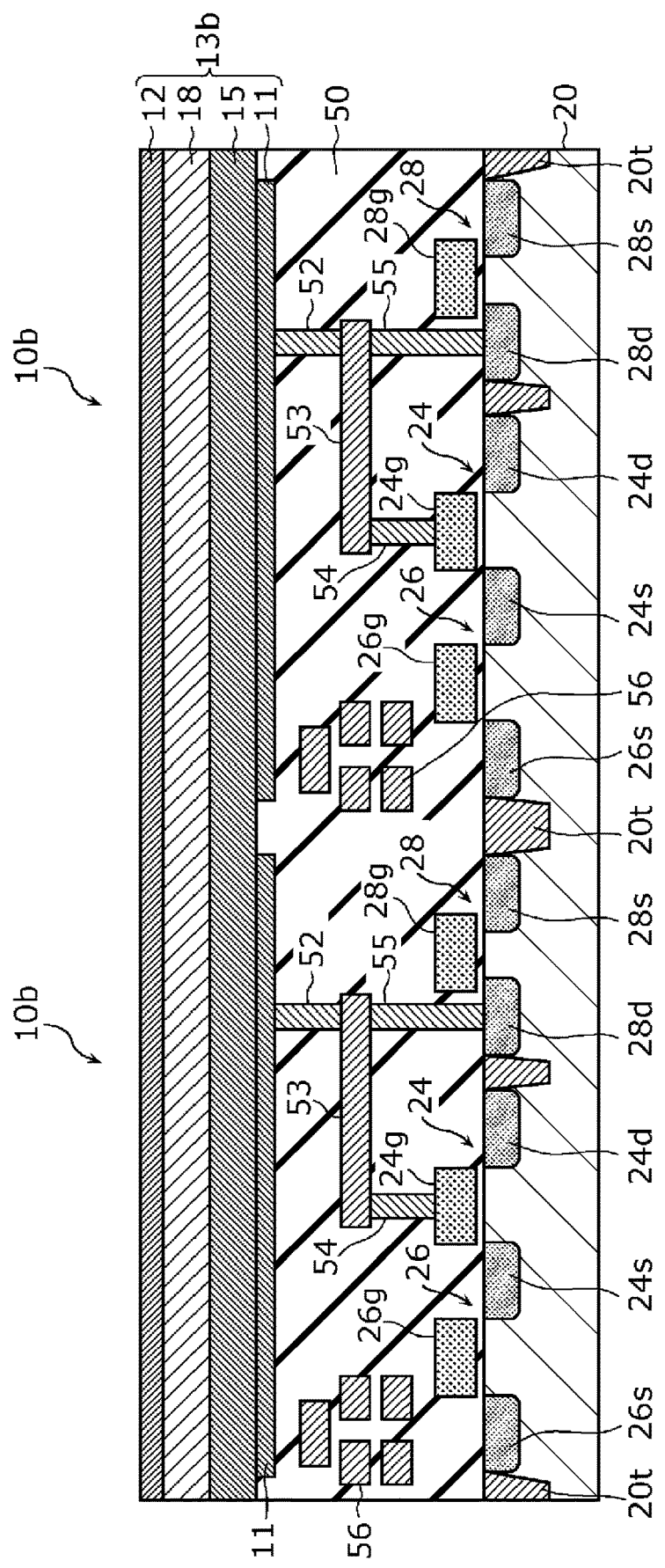
FIG. 12 is a schematic illustration showing a cross-sectional structure of a plurality of pixels in an imaging device according to embodiment 3.

FIG. 12 is a schematic cross-sectional view showing a cross-sectional structure of a plurality of pixels 10b in an imaging device 100 according to the present embodiment. As shown in FIG. 12, the pixels 10b differ from the pixels 10 in embodiment 1 in that the optical filter 16 is not provided and that a photoelectric conversion unit 13b is provided instead of the photoelectric conversion unit 13.

The photoelectric conversion unit 13b includes: the plurality of pixel electrodes 11; the counter electrode 12; the first photoelectric conversion layer 15 located between the counter electrode 12 and the plurality of pixel electrodes 11; and the second photoelectric conversion layer 18 located between the counter electrode 12 and the first photoelectric conversion layer 15. In the present embodiment, the counter electrode 12, the second photoelectric conversion layer 18, the first photoelectric conversion layer 15, and the plurality of pixel electrodes 11 are disposed in this order from the light incident side of the imaging device 100. Specifically, the second photoelectric conversion layer 18 is disposed on the light incident side of the first photoelectric conversion layer 15. The first light-shielding body in the present embodiment includes the second photoelectric conversion layer 18.

The second photoelectric conversion layer 18 contains, for example, a donor material and an acceptor material. The donor material contained in the second photoelectric conversion layer 18 differs from the semiconductor quantum dots and is an electron donating material that functions as a donor for donating electrons to the acceptor material contained in the second photoelectric conversion layer 18. The acceptor material contained in the second photoelectric conversion layer 18 is an electron acceptor material that functions as an acceptor that accepts electrons from the donor material contained in the second photoelectric conversion layer 18. Even when the donor material emits fluorescence upon reception of light, excited electrons move to the acceptor material when an appropriate amount of the acceptor material is contained, so that the occurrence of fluorescence is reduced.

The electron transport material contained in the first photoelectric conversion layer 15 and the acceptor material contained in the second photoelectric conversion layer 18 may be the same material or may be different materials. For example, the acceptor material contained in the first photoelectric conversion layer 15 and the acceptor material contained in the second photoelectric conversion layer 18 may both be C60. The acceptor material contained in the first photoelectric conversion layer 15 may be C60, and the acceptor material contained in the second photoelectric conversion layer 18 may be PCBM.

The second photoelectric conversion layer 18 has a non-zero light absorptance at wavelengths in at least part of the second wavelength range. For example, the second photoelectric conversion layer 18 has a non-zero light absorptance at wavelengths including a wavelength at which the coating material exhibits the maximum light absorptance within the second wavelength range. For example, the second photoelectric conversion layer 18 has a non-zero light absorptance at all the wavelengths in the second wavelength range. For example, the second photoelectric conversion layer 18 transmits substantially no light in the second wavelength range.

The second photoelectric conversion layer 18 absorbs, for example, light with a wavelength equal to or shorter than 1050 nm. In this case, light in the infrared to visible wavelength range is less likely to be absorbed by the coating material. The second photoelectric conversion layer 18 may absorb light with a wavelength equal to or shorter than 700 nm.

The second photoelectric conversion layer 18 has significant light transparency in at least part of the first wavelength range. When the photoelectric conversion layer containing the semiconductor quantum dots has a plurality of light absorption peak wavelengths, the second photoelectric conversion layer 18 may have significant transparency at any of these light absorption peak wavelengths of the semiconductor quantum dots.

For example, it is preferable that wavelengths at which the second photoelectric conversion layer 18 transmits substantially no light are shorter than the shortest wavelength of the plurality of light absorption peak wavelengths of the first photoelectric conversion layer 15 containing the semiconductor quantum dots.

The light transmittance of the second photoelectric conversion layer 18 depends on the light absorption coefficients of the materials forming the second photoelectric conversion layer 18 and the thickness of the second photoelectric conversion layer 18.

Figure 13:
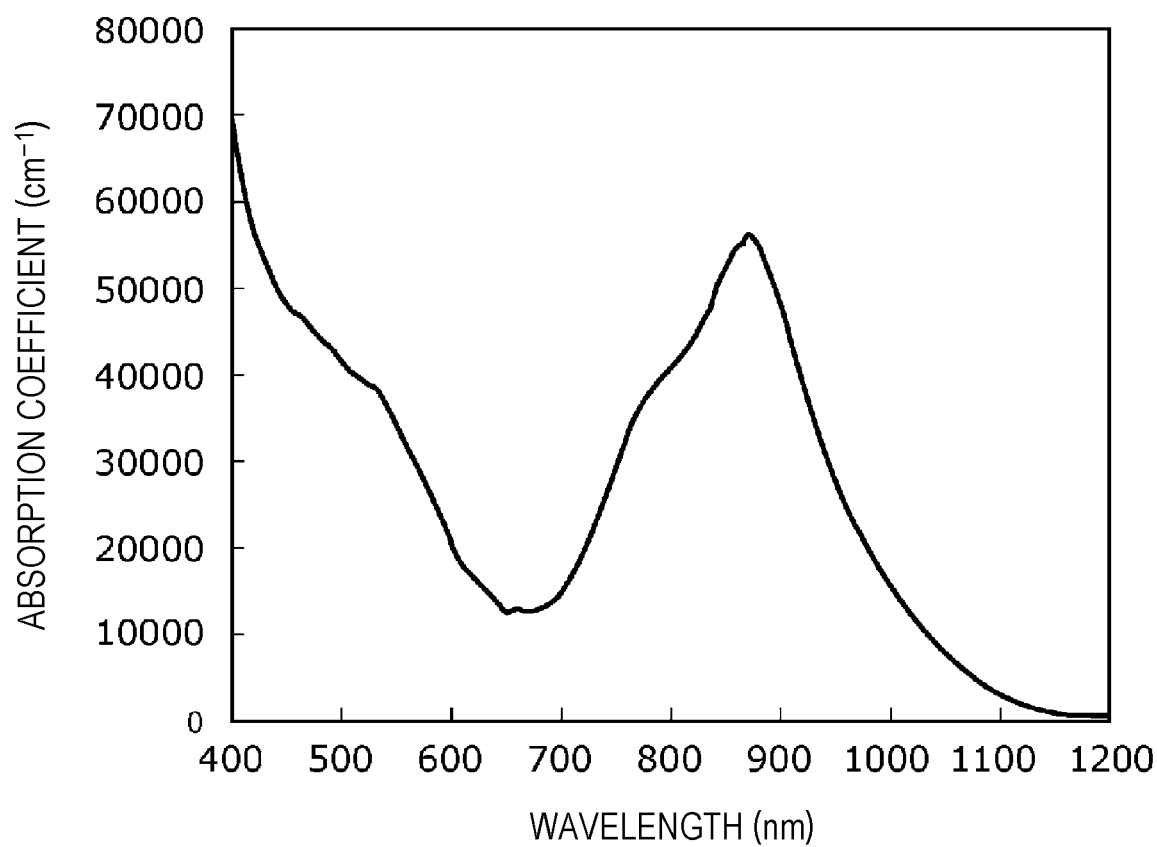
FIG. 13 is a graph showing the absorption spectrum of a $SnNcCl_2$/C70 mixture film.

FIG. 13 is a graph showing the absorption spectrum of a SnNcCl$_2$/C70 mixture film. FIG. 13 shows the absorption spectrum of the mixture film obtained by mixing SnNcCl$_2$ and C70 at a ratio of 1:1. As shown in FIG. 13, when, for example, the donor material in the second photoelectric conversion layer 18 is SnNcCl$_2$ (tin naphthalocyanine dichloride) and the acceptor material is C70, the second photoelectric conversion layer 18 formed as a 1:1 mixture film of the donor material and the acceptor material does not exhibit significant absorption at a wavelength equal to or longer than about 1200 nm. Specifically, the mixture film transmits light with a wavelength equal to or longer than about 1200 nm. However, the mixture film absorbs light with a wavelength equal to or shorter than about 1200 nm. For example, the absorption coefficient of the mixture film in the wavelength range of 600 nm or shorter and in the wavelength range of from 720 nm to 980 nm is equal to or more than $2.0 \times 10^4$ cm$^{-1}$. Therefore, when the thickness of the mixture film is equal to or more than 1000 nm, the transmittance of light in the wavelength range of 600 nm or shorter and in the wavelength range of from 720 nm to 980 nm through the mixture film is equal to or less than 1%. Thus, even when the first photoelectric conversion layer 15 contains, for example, CsPbBr$_2$I as the matrix material, the generation of fluorescence from CsPbBr$_2$I is inhibited because the transmittance of light in the second wavelength range of CsPbBr$_2$I through the second photoelectric conversion layer 18 is equal to or less than 1%. Moreover, for example, even when P3HT, CsSnI$_3$, and CH$_3$NH$_3$SnI$_3$ are contained as the matrix material, the generation of fluorescence from P3HT, CsSnI$_3$, and CH$_3$NH$_3$SnI$_3$ can be inhibited because the transmittance of light in the second wavelength ranges of P3HT, CsSnI$_3$, and CH$_3$NH$_3$SnI$_3$ through the second photoelectric conversion layer 18 is equal to or less than 1%.

The value of the light absorption coefficient may slightly vary depending on the mixing ratio, the film quality, etc.

The donor material contained in the second photoelectric conversion layer 18 may have a quantum efficiency for light in the second wavelength range. In this case, light in the second wavelength range that is absorbed by the donor material contained in the second photoelectric conversion layer 18 is converted to energy for generating hole-electron pairs and is less likely to reach the coating material contained in the first photoelectric conversion layer 15.

No particular limitation is imposed on the donor and acceptor materials contained in the second photoelectric conversion layer 18 so long as these materials can form a mixture film having the transparency described above. The donor material is, for example, quinacridone, phthalocyanine, naphthalocyanine, a quinacridone derivative, a phthalocyanine derivative, or a naphthalocyanine derivative because they have a high absorption coefficient in the ultraviolet to near-infrared wavelength range and function as good donors. The acceptor material may be Alq3 (tris(8-quinolinolato)aluminum), which is a material having a high light absorption coefficient in the range of 300 nm to 500 nm. The second photoelectric conversion layer 18 may contain one donor material, or a plurality of donor materials may be contained in the second photoelectric conversion layer 18. For example, when a plurality of donor materials with different absorption spectra are used, the light transmittance can be reduced in a wider wavelength range.

Embodiment 4

Next, embodiment 4 will be described. Embodiment 4 differs from embodiment 1 in that a first light-shielding donor material instead of the optical filter is used as the first light-shielding body. The difference from embodiment 1 will be mainly described, and the description of common features will be omitted or simplified.

[Structure of Photoelectric Conversion Unit]

Figure 14:
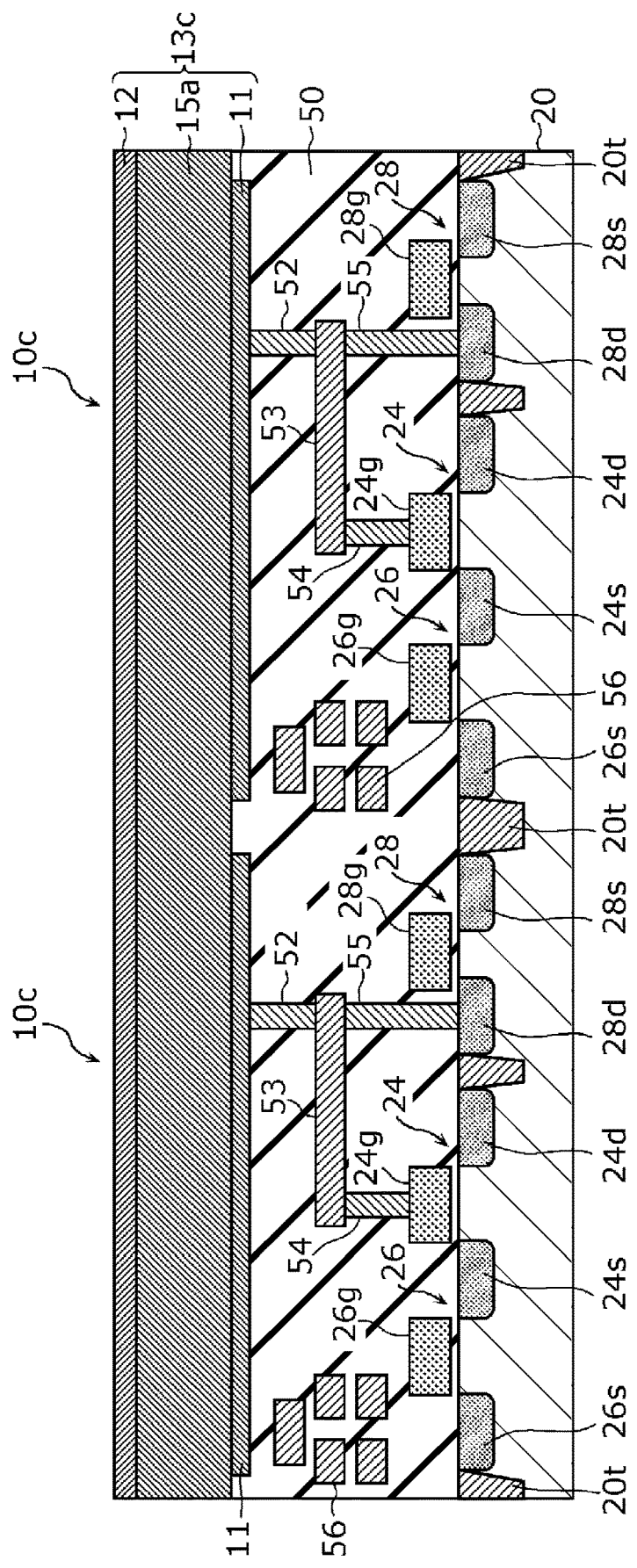
FIG. 14 is a schematic illustration showing a cross-sectional structure of a plurality of pixels in an imaging device according to embodiment 4.

FIG. 14 is a schematic cross-sectional view showing a cross-sectional structure of a plurality of pixels 10c in an imaging device 100 according to the present embodiment. As shown in FIG. 14, the pixels 10c differ from the pixels 10 in embodiment 1 in that the optical filter 16 is not provided and that a photoelectric conversion unit 13c is provided instead of the photoelectric conversion unit 13.

The photoelectric conversion unit 13c includes: the plurality of pixel electrodes 11; the counter electrode 12; and a first photoelectric conversion layer 15a located between the counter electrode 12 and the plurality of pixel electrodes 11. In the present embodiment, the counter electrode 12, the first photoelectric conversion layer 15a, and the plurality of pixel electrodes 11 are disposed in this order from the light incident side of the imaging device 100. The first photoelectric conversion layer 15a contains the semiconductor quantum dots, the coating material, and the first light-shielding donor material. Specifically, the first light-shielding donor material is located in the first photoelectric conversion layer 15a. The first light-shielding donor material is an example of the first material. The first light-shielding body in the present embodiment contains the first light-shielding donor material. The first photoelectric conversion layer 15a may further contain an acceptor material that functions as an acceptor for the semiconductor quantum dots and the first light-shielding donor material.

The first light-shielding donor material generates hole-electron pairs upon reception of incident light. The first light-shielding donor material functions as, for example, a donor for the acceptor material and differs from the semiconductor quantum dots.

The first light-shielding donor material has a non-zero light absorptance at wavelengths in at least part of the second wavelength range. For example, the first light-shielding donor material has a non-zero light absorptance at wavelengths including a wavelength at which the coating material exhibits the maximum light absorptance within the second wavelength range. For example, the first light-shielding donor material has a non-zero light absorptance at all the wavelengths in the second wavelength range. The light absorption coefficient of the first light-shielding donor material in the second wavelength range may be equal to or higher than the light absorption coefficient of the coating material.

For example, the first light-shielding donor material absorbs light with a wavelength equal to or shorter than 1050 nm. In this case, light in the infrared to visible wavelength range is less likely to be absorbed by the coating material. The first light-shielding donor material may absorb light with a wavelength equal to or shorter than 700 nm.

In the present embodiment, light in the second wavelength range that enters the first photoelectric conversion layer 15a may be absorbed by the coating material. However, the light in the second wavelength range may be absorbed also by the first light-shielding donor material. The light absorbed by the first light-shielding donor material is converted to energy for generating hole-electron pairs and is not absorbed by the coating material. Therefore, when the first light-shielding donor material is contained in the first photoelectric conversion layer 15a, the probability of the occurrence of fluorescence due to absorption of light by the coating material decreases.

In the first photoelectric conversion layer 15a, the larger the amount of the first light-shielding donor material relative to the coating material, the smaller the probability of the occurrence of fluorescence due to absorption of light by the coating material. For example, when the first photoelectric conversion layer 15a contains equal amounts of the coating material and the first light-shielding donor material and the light absorption coefficient of the coating material and the light absorption coefficient of the first light-shielding donor material in the second wavelength range are the same, the probability of absorption of light in the second wavelength range by the coating material is one half of that when the first light-shielding donor material is not present.

The first light-shielding donor material is a material that has the light absorption characteristics described above and functions as a donor for the acceptor material. Examples of the first light-shielding donor material include quinacridone, phthalocyanine, naphthalocyanine, quinacridone derivatives, phthalocyanine derivatives, and naphthalocyanine derivatives.

Embodiment 5

Next, embodiment 5 will be described. Embodiment 5 differs from embodiment 1 in that a second light-shielding body is used instead of the first light-shielding body. The second light-shielding body absorbs or reflects light with wavelengths in at least part of the third wavelength range. The second light-shielding body is located in the first photoelectric conversion layer or between the first photoelectric conversion layer and the plurality of pixel electrodes. The details of the second light-shielding body will be described later using various examples. The difference from embodiment 1 will be mainly described, and the description of common features will be omitted or simplified.

[Structure of Photoelectric Conversion Unit]

Figure 15:
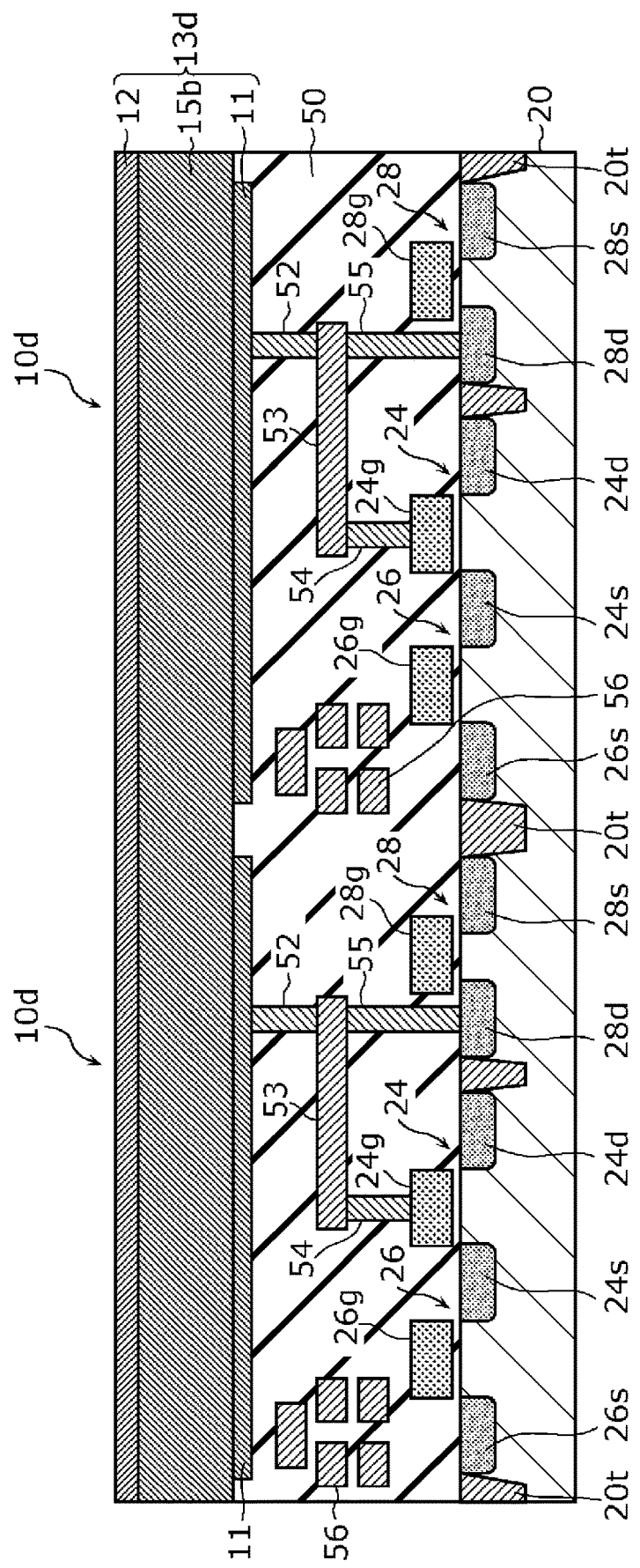
FIG. 15 is a schematic illustration showing a cross-sectional structure of a plurality of pixels in an imaging device according to embodiment 5.

FIG. 15 is a schematic cross-sectional view showing a cross-sectional structure of a plurality of pixels 10d in an imaging device 100 according to the present embodiment. As shown in FIG. 15, the pixels 10d differ from the pixels 10 in embodiment 1 in that the optical filter 16 is not provided and that a photoelectric conversion unit 13d is provided instead of the photoelectric conversion unit 13.

The photoelectric conversion unit 13d includes: the plurality of pixel electrodes 11; the counter electrode 12; and a first photoelectric conversion layer 15b located between the counter electrode 12 and the plurality of pixel electrodes 11. In the present embodiment, the counter electrode 12, the first photoelectric conversion layer 15b, and the plurality of pixel electrodes 11 are disposed in this order from the light incident side of the imaging device 100. The first photoelectric conversion layer 15b contains the semiconductor quantum dots, the coating material, and a second light-shielding donor material. Specifically, the second light-shielding donor material is located in the first photoelectric conversion layer 15b. The second light-shielding donor material is an example of the second material. The second light-shielding body in the present embodiment contains the second light-shieling donor material. The first photoelectric conversion layer 15b may further contain an acceptor material that functions as an acceptor for the semiconductor quantum dots and the second light-shielding donor material.

The second light-shieling donor material generates hole-electron pairs upon reception of incident light. The second light-shieling donor material functions as, for example, a donor for the acceptor material and differs from the semiconductor quantum dots.

The second light-shieling donor material has a non-zero light absorptance at wavelengths in at least part of the third wavelength range, which is the wavelength range of the fluorescence emitted from the coating material. For example, the second light-shielding donor material has a non-zero light absorptance at wavelengths including a wavelength at which the coating material exhibits the maximum fluorescence intensity within the third wavelength range. For example, the second light-shielding donor material has a non-zero light absorptance at all the wavelengths in the third wavelength range.

For example, the second light-shielding donor material absorbs light with a wavelength equal to or shorter than 1150 nm. In this case, light in the near-infrared to visible wavelength range is less likely to reach the semiconductor substrate 20. The second light-shielding donor material may absorb light with a wavelength equal to or shorter than 750 nm.

In the present embodiment, light in the second wavelength range that enters the first photoelectric conversion layer 15b may be absorbed by the coating material. When the coating material absorbs the light in the second wavelength range, the coating material emits fluorescence. However, since the second light-shieling donor material has a non-zero light absorptance in the third wavelength range, part of or all the fluorescence emitted from the coating material is absorbed.

The fluorescence emitted from the coating material and absorbed by the second light-shielding donor material is converted to energy for generating hole-electron pairs, and the electrons generated are separated from the second light-shieling donor material through, for example, the acceptor material, so that the fluorescence vanishes. Therefore, the amount of the fluorescence reachable to the semiconductor substrate 20 is smaller than that when no second light-shieling donor material is present. The larger the amount of the second light-shielding donor material contained in the first photoelectric conversion layer 15b relative to the coating material, the smaller the probability that the fluorescence emitted from the coating material reaches the semiconductor substrate 20.

The second light-shieling donor material is a material that has the light absorption characteristics described above and functions as, for example, a donor for the acceptor material. Examples of the second light-shieling donor material include quinacridone, phthalocyanine, naphthalocyanine, quinacridone derivatives, phthalocyanine derivatives, and naphthalocyanine derivatives.

Embodiment 6

Next, embodiment 6 will be described. Embodiment 6 differs from embodiment 1 in that a second light-shielding body is used instead of the first light-shielding body. Moreover, embodiment 6 differs from embodiment 5 that uses the second light-shielding body in that a second charge transport layer instead of the second light-shieling donor material is used as the second light-shielding body. The differences from embodiments 1 and 5 will be mainly described, and the description of common features will be omitted or simplified.

[Structure of Photoelectric Conversion Unit]

Figure 16:
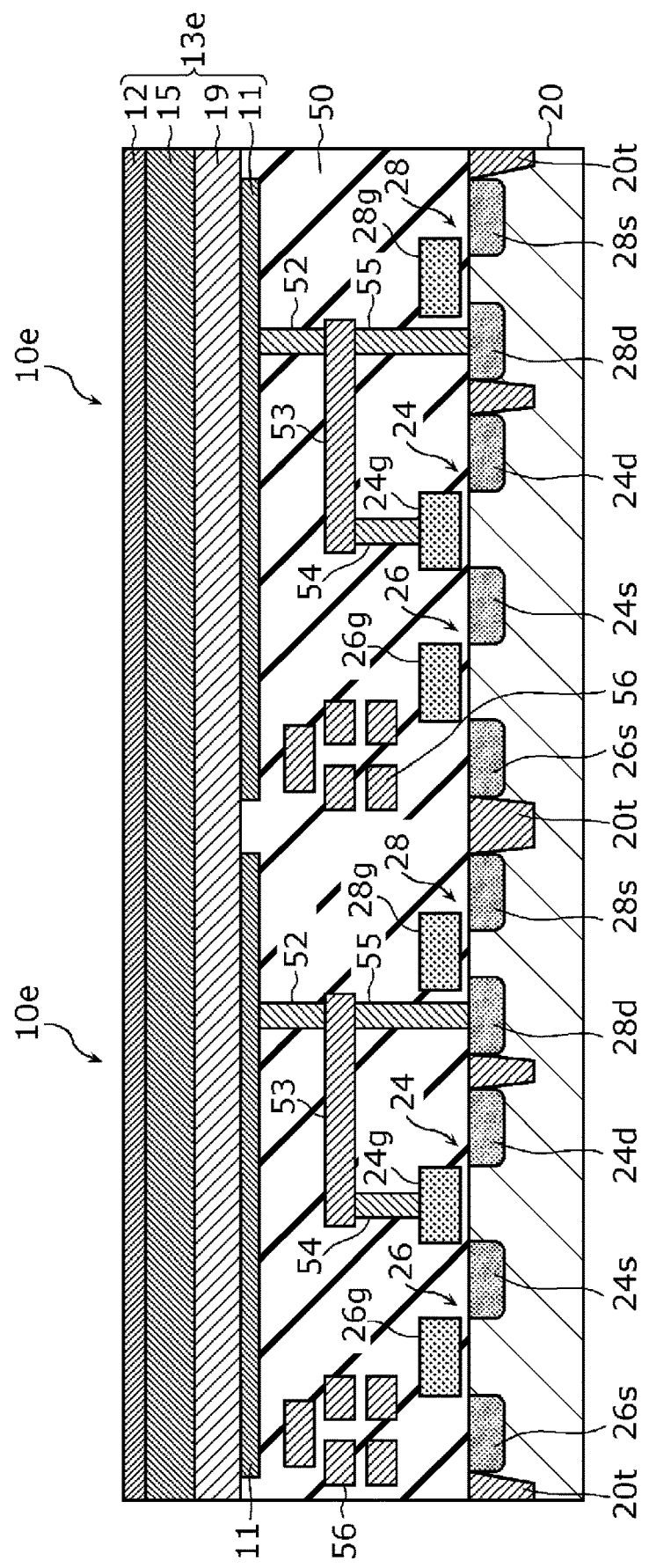
FIG. 16 is a schematic illustration showing a cross-sectional structure of a plurality of pixels in an imaging device according to embodiment 6.

FIG. 16 is a schematic cross-sectional view showing a cross-sectional structure of a plurality of pixels 10e in an imaging device 100 according to the present embodiment. As shown in FIG. 16, the pixels 10e differ from the pixels 10 in embodiment 1 in that the optical filter 16 is not provided and that a photoelectric conversion unit 13e is provided instead of the photoelectric conversion unit 13.

The photoelectric conversion unit 13e includes: the plurality of pixel electrodes 11; the counter electrode 12; the first photoelectric conversion layer 15 located between the counter electrode 12 and the plurality of pixel electrodes 11; and the second charge transport layer 19 located between the first photoelectric conversion layer 15 and the plurality of pixel electrodes 11. In the present embodiment, the counter electrode 12, the first photoelectric conversion layer 15, the second charge transport layer 19, and the plurality of pixel electrodes 11 are disposed in this order from the light incident side of the imaging device 100. Specifically, the second charge transport layer 19 is disposed on the semiconductor substrate 20 side of the first photoelectric conversion layer 15. The second light-shielding body in the present embodiment includes the second charge transport layer 19.

As shown in FIG. 16, the second charge transport layer 19 is disposed in contact with the first photoelectric conversion layer 15 and with the plurality of pixel electrodes 11. The second charge transport layer 19 has the function of transporting charges to be collected by the pixel electrodes 11 among positive and negative charges generated in the first photoelectric conversion layer 15.

The second charge transport layer 19 has a non-zero light absorptance at wavelengths in at least part of the third wavelength range. For example, the second charge transport layer 19 has a non-zero light absorptance at wavelengths including a wavelength at which the coating material exhibits the maximum light fluorescence intensity within the third wavelength range. For example, the second charge transport layer 19 has a non-zero light absorptance at all the wavelengths in the third wavelength range. For example, the second charge transport layer 19 transmits substantially no light in the third wavelength range.

For example, the second charge transport layer 19 absorbs light with a wavelength equal to or shorter than 1150 nm. In this case, light in the near-infrared to visible wavelength range is less likely to reach the semiconductor substrate 20. The second charge transport layer 19 may absorb light with a wavelength equal to or shorter than 750 nm.

The transmittance of the second charge transport layer 19 depends on the light absorption coefficient of the material forming the second charge transport layer 19 and the thickness of the second charge transport layer 19.

For example, the absorption spectrum and the transmittance when C70 having negative charge transportability is used for the second charge transport layer 19 are as described in embodiment 2 using FIGS. 9 and 10. As shown in FIG. 10, the light transmittance of a C70 layer having a thickness equal to or more than 400 nm at a wavelength equal to or shorter than 600 nm is equal to or less than 5%, and the light transmittance of a C70 layer having a thickness equal to or more than 600 nm at a wavelength equal to or shorter than 600 nm is equal to or less than 1%. C70 has the function of transporting negative charges. Therefore, the C70 layer functions as a charge transport layer in an imaging device including pixel electrodes 11 that collect negative charges and also has the function of reducing the ratio of light that has wavelengths equal to or less than 600 nm and reaches the semiconductor substrate 20.

No particular limitation is imposed on the charge transport material of the second charge transport layer 19 so long as the charge transport material has the above-described light transparency. The charge transport material used in an imaging device including pixel electrodes 11 that collect negative charges is, for example, an electron transport material whose lowest unoccupied molecular orbital level energy relative to the vacuum level is equal to or more than about 3.8 eV, and examples of such a material include fullerenes, fullerene derivatives such as PCBM, perylene derivatives such as PTCDA and PTCBI, and non-fullerene-based low-bandgap organic semiconductors such as BT-CIC and $CO_x8DFIC$. In contrast, the charge transport material used in an imaging device including pixel electrodes 11 that collect positive charges is, for example, a hole transport material whose highest occupied molecular orbital level energy relative to the vacuum level is equal to or less than about 5.4 eV, and examples of such a material include quinacridone derivatives, polyacene derivatives, phthalocyanine derivatives, cyanine derivatives, naphthalocyanine derivatives such as $SnNcCl_2$, benzothiadiazole derivatives, and benzobisthiadiazole derivatives. The second charge transport layer 19 may be composed of one material or may be composed of a plurality of materials. For example, a mixture of a plurality of materials having different absorption spectra allows the light transmittance to be reduced in a wider wavelength range. The second charge transport layer 19 may be formed of a mixture of the charge transport material and a non-charge transport material. For example, a material having the function of transporting charges may be selected as the charge transport material, and a material having a desired absorption spectrum, e.g., absorbing light in the third wavelength range, may be selected as the non-charge transport material.

As described above, the second charge transport layer 19 is disposed on the semiconductor substrate 20 side of the first photoelectric conversion layer 15 and absorbs or reflects at least part of light in the third wavelength range. In this case, the amount of light in the third wavelength range that reaches the charge storage regions or the control circuits that are formed from the impurity regions etc. of the semiconductor substrate can be reduced. Therefore, noise etc. generated when the charge storage regions etc. absorb the fluorescence emitted from the coating material can be reduced.

Embodiment 7

Next, embodiment 7 will be described. Embodiment 7 differs from embodiment 1 in that a second light-shielding body is used in addition to the first light-shielding body. The difference from embodiment 1 will be mainly described, and the description of common features will be omitted or simplified.

[Structure of Photoelectric Conversion Unit]

Figure 17:
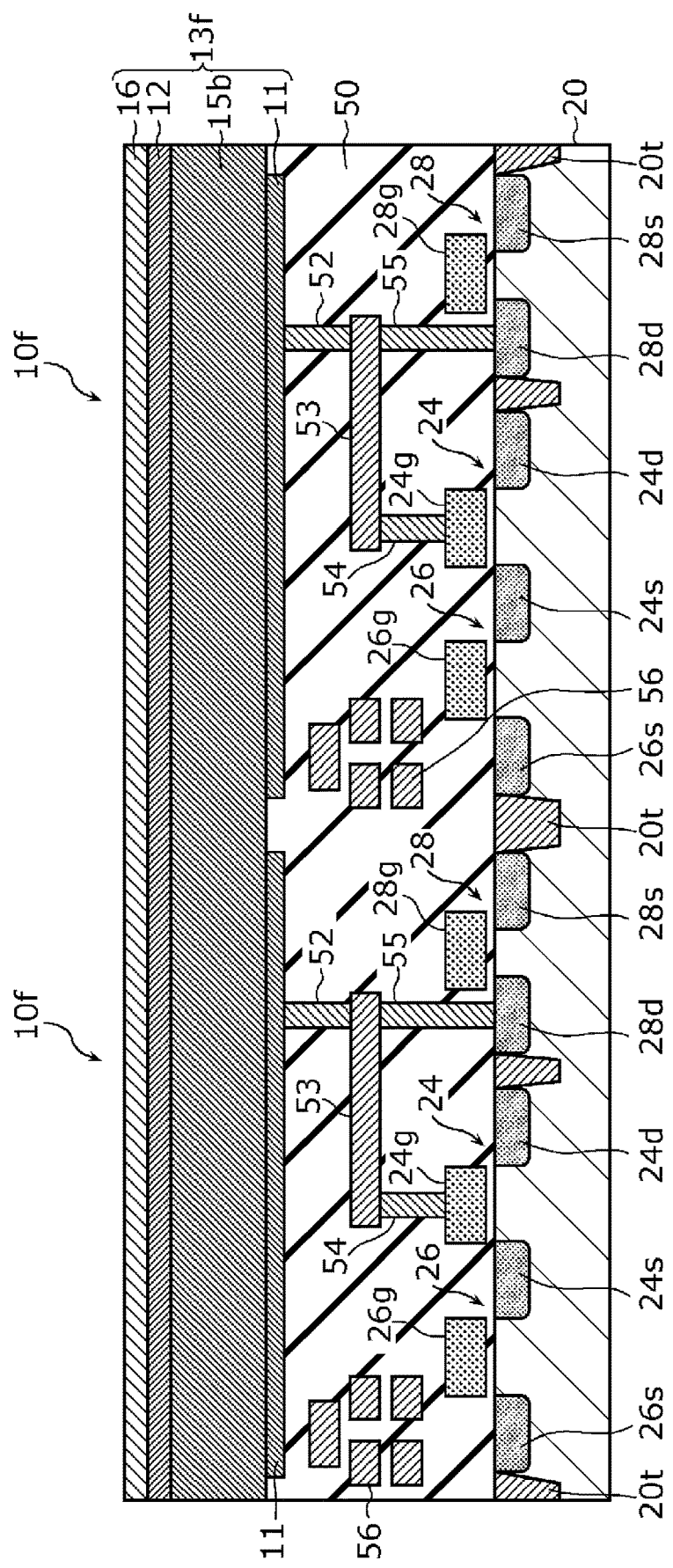
FIG. 17 is a schematic illustration showing a cross-sectional structure of a plurality of pixels in an imaging device according to embodiment 7.

FIG. 17 is a schematic cross-sectional view showing a cross-sectional structure of a plurality of pixels 10f in an imaging device 100 according to the present embodiment. As shown in FIG. 17, the pixels 10f differ from the pixels 10 in embodiment 1 in that a photoelectric conversion unit 13f is provided instead of the photoelectric conversion unit 13.

The photoelectric conversion unit 13f includes: the plurality of pixel electrodes 11; the counter electrode 12; and a first photoelectric conversion layer 15b located between the counter electrode 12 and the plurality of pixel electrodes 11b. The optical filter 16 is disposed on the counter electrode 12 in the photoelectric conversion unit 13f. In the present embodiment, the optical filter 16, the counter electrode 12, the first photoelectric conversion layer 15b, and the plurality of pixel electrodes 11 are disposed in this order from the light incident side of the imaging device 100. Specifically, the optical filter 16 is disposed on the light incident side of the first photoelectric conversion layer 15b. The first photoelectric conversion layer 15b contains the semiconductor quantum dots, the coating material, and the second light-shieling donor material, as in embodiment 5. The first photoelectric conversion layer 15b may further contain an acceptor material that functions as an acceptor for the semiconductor quantum dots and the second light-shielding donor material.

The imaging device 100 according to the present embodiment includes the first light-shielding body and the second light-shielding body. The first light-shielding body in the present embodiment includes the optical filter 16, and the second light-shielding body in the present embodiment includes the second light-shieling donor material. Therefore, the optical filter 16 absorbs or reflects light in the second wavelength range, and emission of fluorescence from the coating material can be reduced. Even when the coating material emits fluorescence, the second light-shieling donor material absorbs the fluorescence, so that the fluorescence is prevented from reaching the semiconductor substrate 20.

OTHER EMBODIMENTS

One or a plurality of modes of the imaging device have been described based on the embodiments. However, the present disclosure is not limited to these embodiments. Various modifications to the embodiments that are conceivable by a person of skill in the art and modes obtained by combining components in difference embodiments are also included in the scope of the present disclosure, so long as they do not depart from the spirit of the present disclosure.

For example, in the above embodiments, the first photoelectric conversion layer is a semiconductor quantum dot layer formed of a mixture of the semiconductor quantum dots and the semiconductor quantum dot-coating material such as the π conjugated compound used as the ligand material or the coating material, but this is not a limitation. The first photoelectric conversion layer may be a photoelectric conversion layer containing both the semiconductor quantum dots and an acceptor material that functions as an acceptor for the semiconductor quantum dots or may be a photoelectric conversion layer having a two-layer structure obtained by joining together a layer containing the semiconductor quantum dots and a layer containing the acceptor material.

For example, in embodiment 6 above, the second charge transport layer is disposed as the second light-shielding body, but this is not a limitation. A third photoelectric conversion layer that absorbs light with wavelengths in at least part of the third wavelength range may be disposed as the second light-shielding body instead of the second charge transport layer.

For example, the imaging device may include a combination of a plurality of the first and second light-shielding bodies used in the above embodiments.

The imaging device according to the present disclosure can be applied to, for example, high-resolution imaging using infrared wavelengths etc. in various camera systems and sensor systems such as medical cameras, monitoring cameras, vehicle-mounted cameras, range cameras, microscope cameras, cameras for drones, and cameras for robots.

What is claimed is:

1. An imaging device comprising:
a semiconductor substrate;
a plurality of pixel electrodes located above the semiconductor substrate and each electrically connected to the semiconductor substrate;
a counter electrode located above the plurality of pixel electrodes;
a first photoelectric conversion layer located between the counter electrode and the plurality of pixel electrodes; and
at least one first light-shielding body located in the first photoelectric conversion layer or above the first photoelectric conversion layer, wherein
the first photoelectric conversion layer contains
semiconductor quantum dots having a property of absorbing light in a first wavelength range and
a coating material that covers the semiconductor quantum dots and that has a property of absorbing light in a second wavelength range and emitting fluorescence in a third wavelength range, and
the at least one first light-shielding body absorbs or reflects light with a wavelength in at least part of the second wavelength range.

2. The imaging device according to claim 1, wherein the at least one first light-shielding body includes an optical filter that is located above the counter electrode and that absorbs or reflects the light with the wavelength in the at least part of the second wavelength range.

3. The imaging device according to claim 1, wherein the at least one first light-shielding body includes a first charge transport layer that is located between the first photoelectric conversion layer and the counter electrode and that absorbs the light with the wavelength in the at least part of the second wavelength range.

4. The imaging device according to claim 1, wherein the at least one first light-shielding body includes a second photoelectric conversion layer that is located between the first photoelectric conversion layer and the counter electrode and that absorbs the light with the wavelength in the at least part of the second wavelength range.

5. The imaging device according to claim 1, wherein
the at least one first light-shielding body contains a first material that differs from the semiconductor quantum dots and that absorbs the light with the wavelength in the at least part of the second wavelength range, and
the first material is located in the first photoelectric conversion layer.

6. The imaging device according to claim 5, wherein the first photoelectric conversion layer further contains a third material, the third material functioning as an acceptor for the semiconductor quantum dots and the first material.

7. The imaging device according to claim 1, wherein the at least one first light-shielding body transmits light with a wavelength in at least part of the first wavelength range.

8. The imaging device according to claim 1, wherein the at least one first light-shielding body absorbs or reflects light with a wavelength equal to or shorter than 1050 nm.

9. The imaging device according to claim 1, further comprising:
at least one second light-shielding body that is located in the first photoelectric conversion layer or between the first photoelectric conversion layer and the plurality of pixel electrodes and that absorbs or reflects light with a wavelength in at least part of the third wavelength range.

10. The imaging device according to claim 8, wherein
the at least one second light-shielding body contains a second material that differs from the semiconductor quantum dots and that absorbs the light with the wavelength in the at least part of the third wavelength range, and
the second material is located in the first photoelectric conversion layer.

11. The imaging device according to claim 10, wherein the first photoelectric conversion layer further contains a third material, the third material functioning as an acceptor for the semiconductor quantum dots and the second material.

12. The imaging device according to claim 9, wherein the at least one second light-shielding body includes a second charge transport layer that is located between the first photoelectric conversion layer and the plurality of pixel electrodes and that absorbs the light with the wavelength in the at least part of the third wavelength range.

13. The imaging device according to claim 1, wherein
the coating material contains at least one selected from the group consisting of a matrix material and a π conjugated ligand material, and
the matrix material contains at least one selected from the group consisting of a semiconducting polymer, a semiconducting copolymer, a semiconducting oligomer, a low-molecular weight semiconductor, a perovskite material, and a double perovskite material.

14. The imaging device according to claim 1, wherein the first photoelectric conversion layer further contains a third material that functions as an acceptor for the semiconductor quantum dots.

15. The imaging device according to claim 1, wherein the semiconductor substrate contains silicon.

16. An imaging device comprising:
a semiconductor substrate;
a plurality of pixel electrodes located above the semiconductor substrate and each electrically connected to the semiconductor substrate;
a counter electrode located above the plurality of pixel electrodes;
a first photoelectric conversion layer located between the counter electrode and the plurality of pixel electrodes; and
at least one second light-shielding body located in the first photoelectric conversion layer or between the first photoelectric conversion layer and the plurality of pixel electrodes, wherein
the first photoelectric conversion layer contains
semiconductor quantum dots having a property of absorbing light in a first wavelength range and
a coating material that covers the semiconductor quantum dots and that has a property of absorbing light in a second wavelength range and emitting fluorescence in a third wavelength range, and
the at least one second light-shielding body absorbs or reflects light with a wavelength in at least part of the third wavelength range.

* * * * *